United States Patent
Noudo

(10) Patent No.: US 11,437,419 B2
(45) Date of Patent: *Sep. 6, 2022

(54) LIGHT SHIELDS FOR SOLID-STATE IMAGING DEVICES AND IMAGING APPARATUSES

(71) Applicant: SONY CORPORATION, Tokyo (JP)

(72) Inventor: Shinichiro Noudo, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/857,096

(22) Filed: Apr. 23, 2020

(65) Prior Publication Data

US 2020/0251513 A1 Aug. 6, 2020

Related U.S. Application Data

(63) Continuation of application No. 15/576,973, filed as application No. PCT/JP2016/062411 on Apr. 19, 2016, now Pat. No. 10,672,813.

(30) Foreign Application Priority Data

Jun. 3, 2015 (JP) .............................. JP2015-113289

(51) Int. Cl.
*H01L 27/146* (2006.01)
*G03B 13/36* (2021.01)
(Continued)

(52) U.S. Cl.
CPC .......... *H01L 27/14623* (2013.01); *G02B 7/34* (2013.01); *G02B 7/346* (2013.01);
(Continued)

(58) Field of Classification Search
CPC ............... H01L 27/14621; H01L 27/14; H01L 27/14623; H01L 27/14627;
(Continued)

(56) References Cited

U.S. PATENT DOCUMENTS 10,672,813 B2 * 6/2020 Noudo .............. H01L 27/14627
2010/0091161 A1 4/2010 Suzuki
(Continued)

FOREIGN PATENT DOCUMENTS

CN 102215330 10/2011
CN 103227897 7/2013
(Continued)

OTHER PUBLICATIONS

Official Action (no English translation available) for Japanese Patent Application No. 2017-521732, dated Feb. 18, 2020, 8 pages.
(Continued)

*Primary Examiner* — Jennifer D Bennett
(74) *Attorney, Agent, or Firm* — Sheridan Ross P.C.

(57) ABSTRACT

Image plane phase difference pixels that can handle incident light at two or more chief ray angles are realized. A solid-state imaging device includes a pixel, the pixel including a microlens that condenses light from a subject, a photoelectric conversion unit that receives the subject light condensed by the microlens to generate an electrical signal according to an amount of received light, and a light shielding portion provided between the photoelectric conversion unit and the microlens. The light shielding portion includes an edge portion formed across over a light receiving surface of the photoelectric conversion unit, and the edge portion includes a first edge portion and a second edge portion at positions different from each other both in a first direction corresponding to an up and down direction of an output image and a second direction corresponding to a left and right direction of the output image.

20 Claims, 10 Drawing Sheets

(51) Int. Cl.
  *H01L 27/14*   (2006.01)
  *G02B 7/34*    (2021.01)
  *H04N 5/232*   (2006.01)
  *H04N 5/369*   (2011.01)

(52) U.S. Cl.
  CPC .............. *G03B 13/36* (2013.01); *H01L 27/14* (2013.01); *H01L 27/14621* (2013.01); *H01L 27/14627* (2013.01); *H01L 27/14685* (2013.01); *H04N 5/232122* (2018.08); *H04N 5/36961* (2018.08)

(58) Field of Classification Search
  CPC ........ H01L 27/14685; H01L 27/14665; G02B 7/346; G02B 7/34; H04N 5/232122; H04N 5/36961; H04N 5/3696; G03B 13/36
  See application file for complete search history.

(56) References Cited

U.S. PATENT DOCUMENTS

| | | | | |
|---|---|---|---|---|
| 2011/0310280 A1* | 12/2011 | Goto | .................. | H04N 5/36961 348/302 |
| 2014/0347516 A1* | 11/2014 | Sano | .................. | H04N 5/37455 348/230.1 |
| 2015/0109499 A1 | 4/2015 | Yamashita | | |
| 2016/0255294 A1* | 9/2016 | Hiasa | .................. | H04N 5/23235 348/302 |
| 2016/0343753 A1* | 11/2016 | Asatsuma | ......... | H01L 27/14609 |

FOREIGN PATENT DOCUMENTS

| | | |
|---|---|---|
| CN | 105828000 | 8/2016 |
| JP | 2008-209761 | 9/2008 |
| JP | 2011-221290 | 11/2011 |
| JP | 2012-003080 | 1/2012 |
| JP | 2012-182332 | 9/2012 |
| JP | 2013-157883 | 8/2013 |
| JP | 2014-228671 | 12/2014 |
| JP | 2015-015295 | 1/2015 |
| JP | 2015-032640 | 2/2015 |
| JP | 2016-138935 | 8/2016 |
| JP | 2016-162833 | 9/2016 |

OTHER PUBLICATIONS

Official Action (no English translation available) for Japanese Patent Application No. 2017-521732, dated May 19, 2020, 5 pages.
Official Action (no English translation available) for Japanese Patent Application No. 2017-521732, dated Nov. 17, 2020, 2 pages.
Official Action (with English translation) for China Patent Application No. 201680030158.0, dated Apr. 6, 2021, 35 pages.

* cited by examiner

LIGHT SHIELDS FOR SOLID-STATE IMAGING DEVICES AND IMAGING APPARATUSES

CROSS REFERENCE TO RELATED APPLICATIONS

This application is a continuation of U.S. application Ser. No. 15/576,973 filed Nov. 27, 2017 which is a national stage application under 35 U.S.C. 371 and claims the benefit of PCT Application No. PCT/JP2016/062411 having an international filing date of Apr. 19, 2016, which designated the United States, which PCT application claimed the benefit of Japanese Patent Application No. 2015-113289 filed Jun. 3, 2015, the disclosures of which are incorporated herein by reference in their entirety.

TECHNICAL FIELD

The present technique relates to a solid-state imaging device, an imaging apparatus, and a manufacturing method of a solid-state imaging device.

BACKGROUND ART

In recent years, an imaging apparatus provided with an auto focus (AF) function for automatically adjusting the focus during imaging is widely used. The AF systems are roughly classified into an active system and a passive system. In the active system, the time of return of a reflected wave, such as infrared light and ultrasound, applied to an object (subject) and the illumination angle are used to detect the distance. In the passive system, an image captured by a lens is used to measure the distance. There are a contrast detection system and a phase difference detection system in the passive system.

Examples of the phase difference detection system include: a system provided with an image sensor dedicated to phase difference AF in addition to an image sensor for imaging; and an image plane phase difference AF system in which phase difference detection pixels are incorporated into an imaging sensor. In either system, the light entering from the lens is divided into two (pupil division), and the focus position is detected from the deviation of the images. The former is provided with the image sensor dedicated to the phase difference AF in addition to the image sensor for imaging, and there is a disadvantage that the size of the imaging apparatus becomes large. The latter has an advantage that the size of the imaging apparatus can be small because the pixels for phase difference detection (phase difference detection pixels) are incorporated into the image sensor for imaging.

In the image plane phase difference AF system, an AF operation is performed based on phase difference signals acquired from the phase difference detection signals. A plurality of image plane phase difference pixels are arranged in an angle of view, and the pixels have a pixel structure such that left and right halves or upper and lower halves of openings on photodiodes as light receiving devices are shielded. The image plane phase difference pixels are provided in pairs, in which one half of the subject light is shielded in one image plane phase difference pixel, and the other half of the subject light is shielded in the other image plane phase difference pixel. One phase difference signal is created based on different incident angle characteristics of the image plane phase difference pixels in pairs (for example, see PTL 1).

PTL 1 discloses a light shielding portion of the image plane phase difference pixel formed such that the position of an imaging point of a microlens and the position of an edge portion on an entrance side of the light shielding portion are separated according to the change in the image height. Although the angle of incidence of the subject light entering the image sensor is gradually deviated from the imaging point of the microlens outside of the axis of the set lens, the technique of PTL 1 can be applied to design the position of the end portion on the entrance side of the light shielding portion in line with the angle of incidence of the subject light from the set lens according to the coordinates in the chip.

CITATION LIST

Patent Literature

[PTL 1]
JP 2012-182332A

SUMMARY

Technical Problems

However, in a lens interchangeable imaging apparatus, the chief ray angle is different depending on the installed lens, and the image plane phase difference pixels need to be provided according to the chief ray angle of each lens. Even if there is one lens, the chief ray angle changes with a change in the zoom position, and the image plane phase difference pixels need to be provided according to the chief ray angle of each zoom position. Even if a plurality of lenses or zoom positions with similar properties of the chief ray angle are grouped, and the image plane phase difference pixels are provided for each group, a large number of image plane phase difference pixels need to be provided when the angle range of the lens line-up or the angle range of the zoom position is wide. The image plane phase difference pixels are handled as defective pixels that cannot be used as constituent elements of the captured image, and an increase in the image plane phase difference pixels degrades the image quality of the captured image.

The present technique has been made in view of the problems, and an object of the present technique is to realize a solid-state imaging device including image plane phase difference pixels that can handle incident light at two or more chief ray angles, a solid-state imaging apparatus including the solid-state imaging device, and a manufacturing method of the solid-state imaging device.

Solution to Problems

An aspect of the present technique provides a solid-state imaging device including a pixel, the pixel including a microlens that condenses light from a subject, a photoelectric conversion unit that receives the subject light condensed by the microlens to generate an electrical signal according to an amount of received light, and a light shielding portion provided between the photoelectric conversion unit and the microlens. The light shielding portion includes an edge portion formed across over a light receiving surface of the photoelectric conversion unit, and the edge portion includes a first edge portion and a second edge portion at positions different from each other both in a first direction corresponding to an up and down direction of an output image and a second direction corresponding to a left and right direction of the output image.

Another aspect of the present technique provides a solid-state imaging device including a pixel, the pixel including a microlens that condenses light from a subject, a photoelectric conversion unit that receives the subject light condensed by the microlens to generate an electrical signal according to an amount of received light, and a light shielding portion provided between the light receiving element and the microlens. The light shielding portion includes an edge portion formed across over a light receiving surface of the photoelectric conversion unit, and the edge portion includes a stepped portion on a midway of the edge portion.

A further aspect of the present technique provides a solid-state imaging device including a pixel, the pixel including a microlens that condenses light from a subject, a photoelectric conversion unit that receives the subject light condensed by the microlens to generate an electrical signal according to an amount of received light, and a light shielding portion provided between the light receiving element and the microlens. The pixel is formed at a corner section of the solid-state imaging device, the light shielding portion includes an edge portion formed across over a light receiving surface of the photoelectric conversion unit, and the edge portion is formed across over the light receiving surface of the photoelectric conversion unit in a third direction different from both a first direction corresponding to an up and down direction of an output image and a second direction corresponding to a left and right direction of the output image.

A further aspect of the present technique provides an imaging apparatus including a solid-state imaging device and a focus determination unit. The solid-state imaging device includes a pixel, the pixel including a microlens that condenses light from a subject, a photoelectric conversion unit that receives the subject light condensed by the microlens to generate an electrical signal according to an amount of received light, and a light shielding portion provided between the photoelectric conversion unit and the microlens. The light shielding portion includes an edge portion formed across over a light receiving surface of the photoelectric conversion unit, and the edge portion includes a first edge portion and a second edge portion at positions different from each other both in a first direction corresponding to an up and down direction of an output image and a second direction corresponding to a left and right direction of the output image. The focus determination unit performs focus determination through phase difference detection based on the signal generated by the pixel.

A further aspect of the present technique provides an imaging apparatus including a solid-state imaging device and a focus determination unit. The solid-state imaging device includes a pixel, the pixel including a microlens that condenses light from a subject, a photoelectric conversion unit that receives the subject light condensed by the microlens to generate an electrical signal according to an amount of received light, and a light shielding portion provided between the light receiving element and the microlens. The light shielding portion includes an edge portion formed across over a light receiving surface of the photoelectric conversion unit, and the edge portion includes a stepped portion on a midway of the edge portion. The focus determination unit performs focus determination through phase difference detection based on the signal generated by the pixel.

A further aspect of the present technique provides an imaging apparatus including a solid-state imaging device and a focus determination unit. The solid-state imaging device includes a pixel, the pixel including a microlens that condenses light from a subject, a photoelectric conversion unit that receives the subject light condensed by the microlens to generate an electrical signal according to an amount of received light, and a light shielding portion provided between the light receiving element and the microlens. The pixel is formed at a corner section of the solid-state imaging device, the light shielding portion includes an edge portion formed across over a light receiving surface of the photoelectric conversion unit, and the edge portion is formed across over the light receiving surface of the photoelectric conversion unit in a third direction different from both a first direction corresponding to an up and down direction of an output image and a second direction corresponding to a left and right direction of the output image. The focus determination unit performs focus determination through phase difference detection based on the signal generated by the pixel.

A further aspect of the present technique provides a manufacturing method of a solid-state imaging device, the manufacturing method including a step of forming a pixel, the pixel including a microlens that condenses light from a subject, a photoelectric conversion unit that receives the subject light condensed by the microlens to generate an electrical signal according to an amount of received light, and a light shielding portion provided between the photoelectric conversion unit and the microlens. The light shielding portion includes an edge portion formed across over a light receiving surface of the photoelectric conversion unit, and the edge portion includes a first edge portion and a second edge portion at positions different from each other both in a first direction corresponding to an up and down direction of an output image and a second direction corresponding to a left and right direction of the output image.

A further aspect of the present technique provides a manufacturing method of a solid-state imaging device, the manufacturing method including a step of forming a pixel, the pixel including a microlens that condenses light from a subject, a photoelectric conversion unit that receives the subject light condensed by the microlens to generate an electrical signal according to an amount of received light, and a light shielding portion provided between the light receiving element and the microlens. The light shielding portion includes an edge portion formed across over a light receiving surface of the photoelectric conversion unit, and the edge portion includes a stepped portion on a midway of the edge portion.

A further aspect of the present technique provides a manufacturing method of a solid-state imaging device, the manufacturing method including a step of forming a pixel, the pixel including a microlens that condenses light from a subject, a photoelectric conversion unit that receives the subject light condensed by the microlens to generate an electrical signal according to an amount of received light, and a light shielding portion provided between the light receiving element and the microlens. The pixel is formed at a corner section of the solid-state imaging device, the light shielding portion includes an edge portion formed across over a light receiving surface of the photoelectric conversion unit, and the edge portion is formed across over the light receiving surface of the photoelectric conversion unit in a third direction different from both a first direction corresponding to an up and down direction of an output image and a second direction corresponding to a left and right direction of the output image.

Note that the solid-state imaging device and the solid-state imaging apparatus described above include various other modes. For example, the solid-state imaging device and the solid-state imaging apparatus can be incorporated into other devices and implemented or can be implemented along with other methods. The present technique can also be realized as an imaging system including the solid-state imaging device or the solid-state imaging apparatus. The manufacturing method of the solid-state imaging device includes various modes. For example, the manufacturing method can be implemented as part of another method, or the manufacturing method can be realized as a manufacturing apparatus of the solid-state imaging device including means corresponding to each step or as a solid-state imaging apparatus including the solid-state imaging device created by the manufacturing method.

Advantageous Effects of Invention

According to the present technique, a solid-state imaging device including image plane phase difference pixels that can handle incident light at two or more chief ray angles, a solid-state imaging apparatus including the solid-state imaging device, and a manufacturing method of the solid-state imaging device can be realized. Note that the advantageous effects described in the present specification are illustrative only and are not limited. There may be additional advantageous effects.

DESCRIPTION OF EMBODIMENTS

Hereinafter, the present technique will be described in the following order.
(A) First Embodiment:
(B) Second Embodiment:
(C) Third Embodiment:

(A) First Embodiment

Figure 1:
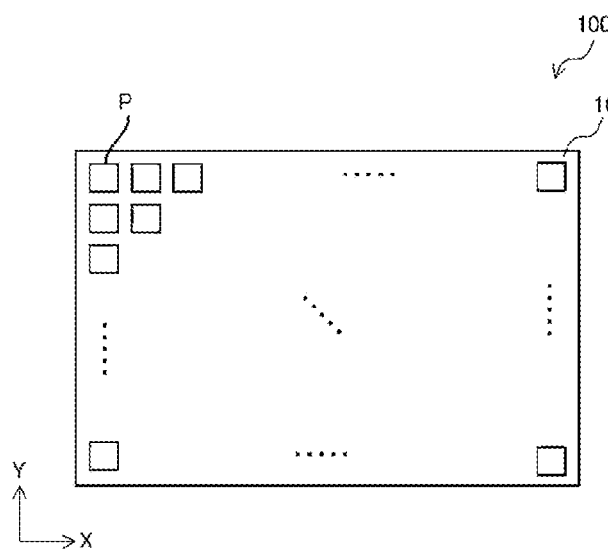
FIG. 1 is a diagram describing a structure of a solid-state imaging device according to a first embodiment.

FIG. 1 is a diagram describing a structure of a solid-state imaging device 100 according to the present embodiment.

The solid-state imaging device 100 includes a light receiving unit 10 provided with a plurality of pixels P arranged on a two-dimensional plane. Examples of the arrangement on the two-dimensional plane include a diagonal arrangement, a delta arrangement, a honeycomb arrangement, and various other two-dimensional arrangements.

Figure 2:
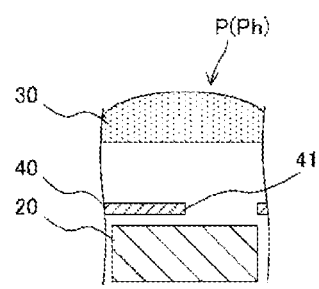
FIG. 2 is a diagram describing a first edge portion and a second edge portion in an edge portion of a light shielding portion.

FIG. 2 is a diagram schematically depicting a cross-sectional shape of the pixel. As depicted in this figure, each pixel P includes: a photodiode 20 as a photoelectric conversion unit that generates an electrical signal according to incident light; and a microlens 30 provided separately from a light receiving surface of the photodiode 20.

In addition to the photodiodes 20 and the microlenses 30, part or all of the plurality of pixels P include light shielding portions 40 provided between the photodiodes 20 and the microlenses 30. Hereinafter, the pixels including the light shielding portions 40 will be referred to as pixels Ph. The light shielding portion 40 includes an edge portion 41 formed across over the light receiving surface of the photodiode 20.

FIGS. 3 to 11 are diagrams describing first edge portions 411 and second edge portions 412 in the edge portions 41 of various light shielding portions 40.

The light shielding portion 40 includes the edge portion 41 formed across over the light receiving surface of the photodiode 20, and the edge portion 41 includes the first edge portion 411 and the second edge portion 412 at positions different from each other both in a first direction D1 corresponding to an up and down direction in an output image of the solid-state imaging device 100 and a second direction D2 corresponding to a left and right direction of the output image.

In the light shielding portion 40 depicted in FIG. 3(a), the edge portion 41 connects an upper side and a lower side of a pixel Ph1. In the light shielding portion 40 depicted in FIG. 3(b), the edge portion 41 connects an upper side and a lower side of a pixel Ph2. The edge portion 41 is formed substantially in the first direction D1 (direction corresponding to the up and down direction in the output image of the solid-state imaging device 100) across over the light receiving surface of the photodiode 20. The edge portions 41 of the pixels Ph1 and Ph2 each include a stepped portion 41G on the midway of the edge portion 41 formed across over the light receiving surface of the photodiode 20. The stepped portion 41G is a part of the edge portion 41 extending in the second direction D2 different from the first direction D1.

In the edge portion 41, one side across the stepped portion 41G constitutes the first edge portion 411, and the other side across the stepped portion 41G constitutes the second edge portion 412. The first edge portion 411 and the second edge portion 412 are provided such that at least one radiation ray Dr extending from an optical axis center 11c (see FIG. 9) of the light receiving surface 10 of the solid-state imaging device 100 intersects with both the first edge portion 411 and the second edge portion 412.

Therefore, the first edge portion 411 and the second edge portion 412 are provided at different positions in the first direction D1 and are also provided at different positions in the second direction D2 due to the offset by the stepped portion 41G.

Figure 3:
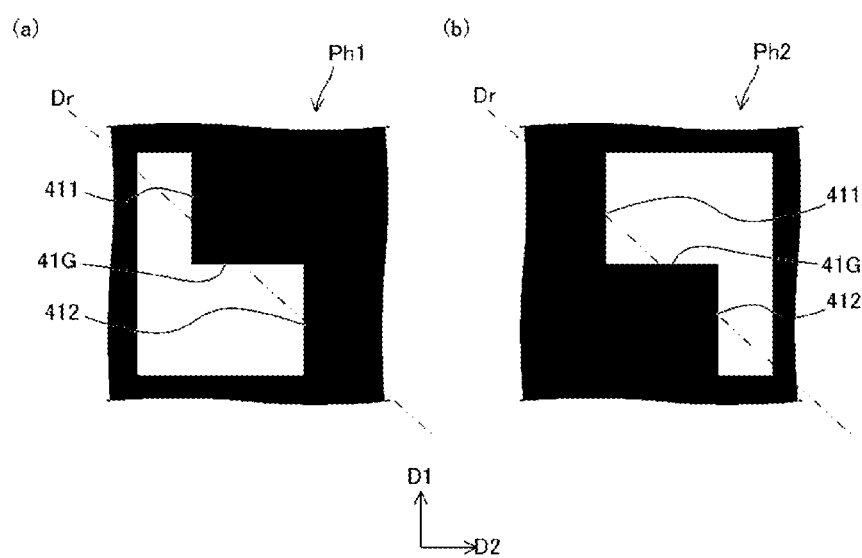
FIG. 3 is a diagram describing first edge portions and second edge portions in edge portions of light shielding portions.

Note that, although the number of stepped portions 41G is one in the example illustrated in FIG. 3, the number of stepped portions 41G is not limited to this, and two or more arbitrary number of stepped portions 41G may be provided on the edge portion 41 to divide the edge portion into three or more portions. All of the edge portions divided by the stepped portions 41G are provided to intersect with at least one radiation ray Dr extending from the optical axis center 11c of the light receiving surface 10 of the solid-state imaging device 100.

In the light shielding portion 40 depicted in FIG. 4(a), the edge portion 41 connects a left side and a right side of the pixel Ph1. In the light shielding portion 40 depicted in FIG. 4(b), the edge portion 41 connects a left side and a right side of the pixel Ph2. The edge portion 41 is formed substantially in the second direction D2 (direction corresponding to the left and right direction in the output image of the solid-state imaging device 100) across over the light receiving surface of the photodiode 20. The edge portions 41 of the pixels Ph1 and Ph2 each include the stepped portion 41G on the midway of the edge portion 41 formed across over the light receiving surface of the photodiode 20. The stepped portion 41G is a part of the edge portion 41 extending in the first direction D1 different from the second direction D2.

In the edge portion 41, one side across the stepped portion 41G constitutes the first edge portion 411, and the other side across the stepped portion 41G constitutes the second edge portion 412. The first edge portion 411 and the second edge portion 412 are provided such that at least one radiation ray Dr extending from the optical axis center 11c of the light receiving surface 10 of the solid-state imaging device 100 intersects with both the first edge portion 411 and the second edge portion 412.

Therefore, the first edge portion 411 and the second edge portion 412 are provided at different positions in the second direction D2 and are also provided at different positions in the first direction D1 due to the offset by the stepped portion 41G.

Figure 4:
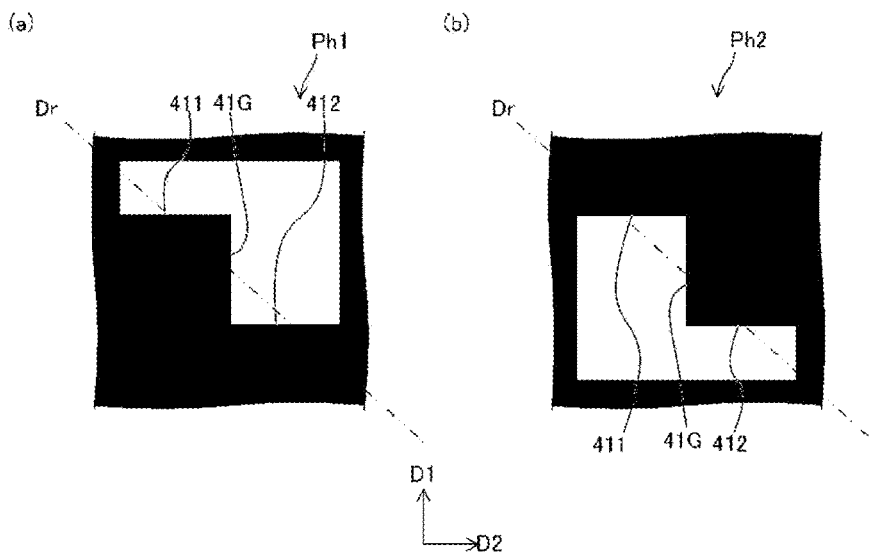
FIG. 4 is a diagram describing the first edge portions and the second edge portions in the edge portions of the light shielding portions.

Note that, although the number of stepped portions 41G is one in the example illustrated in FIG. 4, the number of stepped portions 41G is not limited to this, and two or more arbitrary number of stepped portions 41G may be provided on the edge portion 41 to divide the edge portion into three or more portions. All of the edge portions divided by the stepped portions 41G are provided to intersect with at least one radiation ray Dr extending from the optical axis center 11c of the light receiving surface 10 of the solid-state imaging device 100.

In the light shielding portion 40 depicted in FIG. 5(a), the edge portion 41 connects the upper side and the lower side of the pixel Ph1. In the light shielding portion 40 depicted in FIG. 5(b), the edge portion 41 connects the upper side and the lower side of the pixel Ph2. The edge portion 41 is formed across over the light receiving unit 10 of the photodiode 20 in a third direction D3 different from both the first direction D1 and the second direction D2. Therefore, the edge portions 41 of the pixels Ph1 and Ph2 have a shape extending in a direction inclined with respect to the up and down and left and right directions.

In the edge portion 41 extending in the third direction D3, different parts constitute the first edge portion 411 and the second edge portion 412. The edge portion 41 extends in the third direction D3 different from both the first direction D1 and the second direction D2, and the positions of the first edge portion 411 and the second edge portion 412 are different both in the second direction D2 and the first direction D1.

Figure 5:
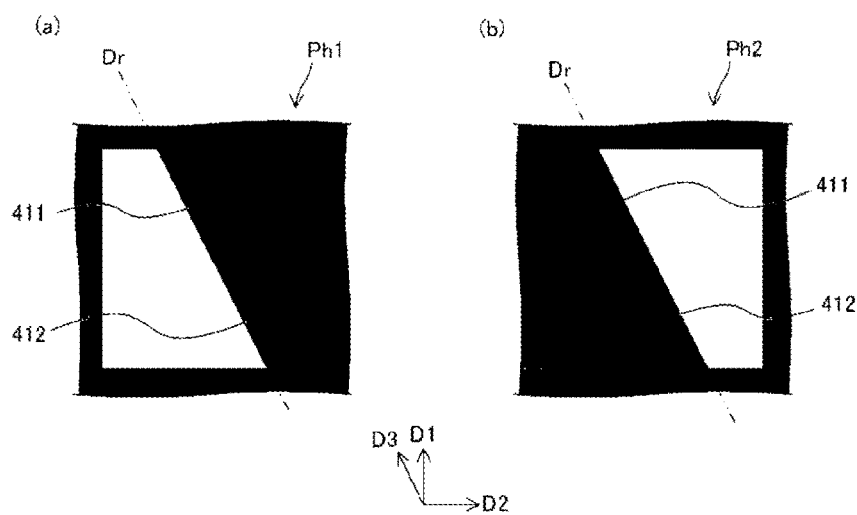
FIG. 5 is a diagram describing the first edge portions and the second edge portions in the edge portions of the light shielding portions.

Note that, although two edge portions, the first edge portion 411 and the second edge portion 412, are set on the edge portion 41 in the example illustrated in FIG. 5, an arbitrary number of edge portions other than the first edge portion 411 and the second edge portion 412 can be set on the edge portion 41. The first edge portion 411, the second edge portion 412, and the other edge portions set on the edge portion 41 all intersect with at least one radiation ray Dr extending from the optical axis center 11c of the light receiving surface 10 of the solid-state imaging device 100.

In the light shielding portion 40 depicted in FIG. 6(a), the edge portion 41 connects the left side and the right side of the pixel Ph1. In the light shielding portion 40 depicted in FIG. 6(b), the edge portion 41 connects the left side and the right side of the pixel Ph2. The edge portion 41 is formed across over the light receiving unit 10 of the photodiode 20 in a fourth direction D4 different from both the first direction D1 and the second direction D2. Therefore, the edge portions 41 of the pixels Ph1 and Ph2 have a shape extending in a direction inclined with respect to the up and down and left and right directions.

In the edge portion 41 extending in the fourth direction D4, different parts constitute the first edge portion 411 and the second edge portion 412. The edge portion 41 extends in the fourth direction D4 different from both the first direction D1 and the second direction D2, and the positions of the first edge portion 411 and the second edge portion 412 are different both in the second direction D2 and the first direction D1.

Note that, although two edge portions, the first edge portion 411 and the second edge portion 412, are set on the edge portion 41 in the example illustrated in FIG. 5, an arbitrary number of edge portions other than the first edge portion 411 and the second edge portion 412 can be set on the edge portion 41. The first edge portion 411, the second edge portion 412, and the other edge portions set on the edge portion 41 all intersect with at least one radiation ray Dr extending from the optical axis center 11c of the light receiving surface 10 of the solid-state imaging device 100.

Figure 7:
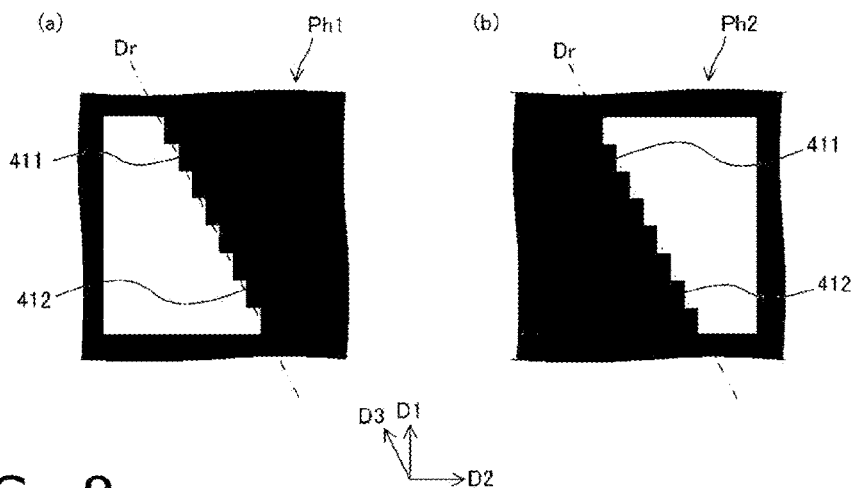
FIG. 7 is a diagram describing the first edge portions and the second edge portions in the edge portions of the light shielding portions.

In the light shielding portions 40 depicted in FIG. 7, the edge portions 41 connect the upper sides and the lower sides of the pixels Ph1 and Ph2 as in the light shielding portions 40 depicted in FIG. 5, and the edge portions 41 are formed across over the light receiving surfaces of the photodiodes 20 in the third direction D3 different from both the first direction D1 and the second direction D2. However, the edge portions 41 depicted in FIG. 7 are formed in zigzags with combinations of direction lines extending in directions different from the third direction D3 (first direction D1 and second direction D2 in FIG. 7).

The first edge portion 411 and the second edge portion 412 are separately provided on the direction line extending in the first direction D1 on the edge portion 41 extending in the third direction D3. As a result, the edge portion 41 includes the first edge portion 411 and the second edge portion 412 at positions different from each other both in the first direction D1 and the second direction D2. Note that the edge portion 41 of the light shielding portion 40 of the pixel Ph depicted in FIG. 3 described above can be considered as one of the modes with the zigzag edge portion 41 depicted in FIG. 7.

Figure 6:
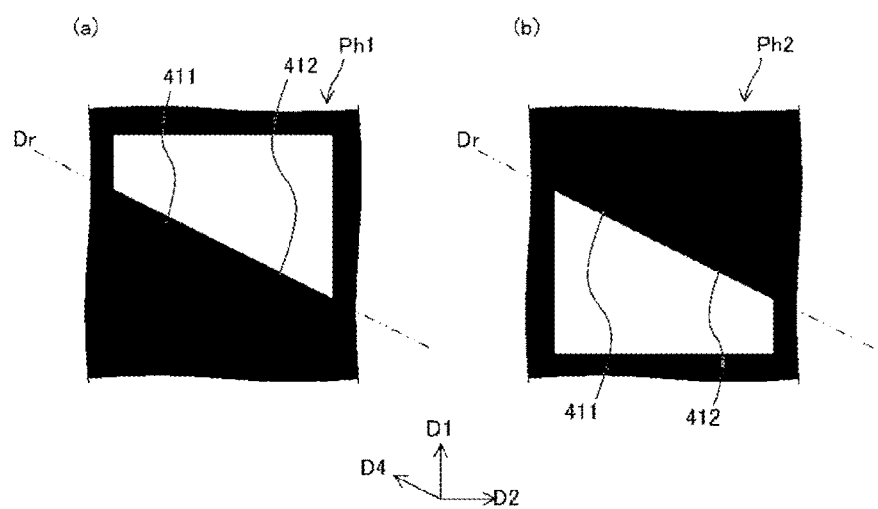
FIG. 6 is a diagram describing the first edge portions and the second edge portions in the edge portion of the light shielding portions.
Figure 8:
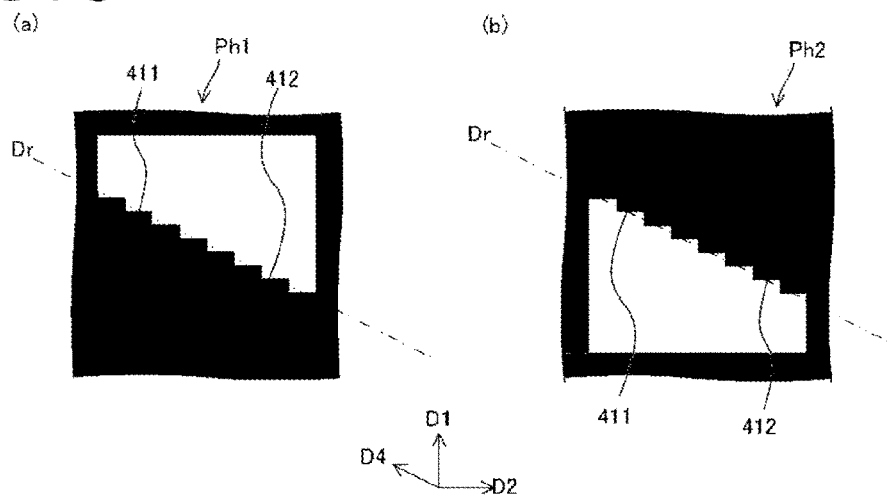
FIG. 8 is a diagram describing the first edge portions and the second edge portions in the edge portions of the light shielding portions.

In the light shielding portions 40 depicted in FIG. 8, the edge portions 41 connect the left sides and the right sides of the pixels Ph1 and Ph2 as in the light shielding portions 40 depicted in FIG. 6, and the edge portions 41 are formed across over the light receiving surfaces of the photodiodes 20 in the fourth direction D4 different from both the first direction D1 and the second direction D2. However, the edge portions 41 depicted in FIG. 8 are formed in zigzags with combinations of direction lines extending in directions different from the fourth direction D4 (first direction D1 and second direction D2 in FIG. 8).

The first edge portion 411 and the second edge portion 412 are separately provided on the direction line extending in the second direction D2 on the edge portion 41 extending in the fourth direction D4. As a result, the edge portion 41 includes the first edge portion 411 and the second edge portion 412 at positions different from each other both in the first direction D1 and the second direction D2. Note that the edge portion 41 of the light shielding portion 40 of the pixel Ph depicted in FIG. 4 described above can be considered as one of the modes with the zigzag edge portion 41 depicted in FIG. 8.

Figure 9:
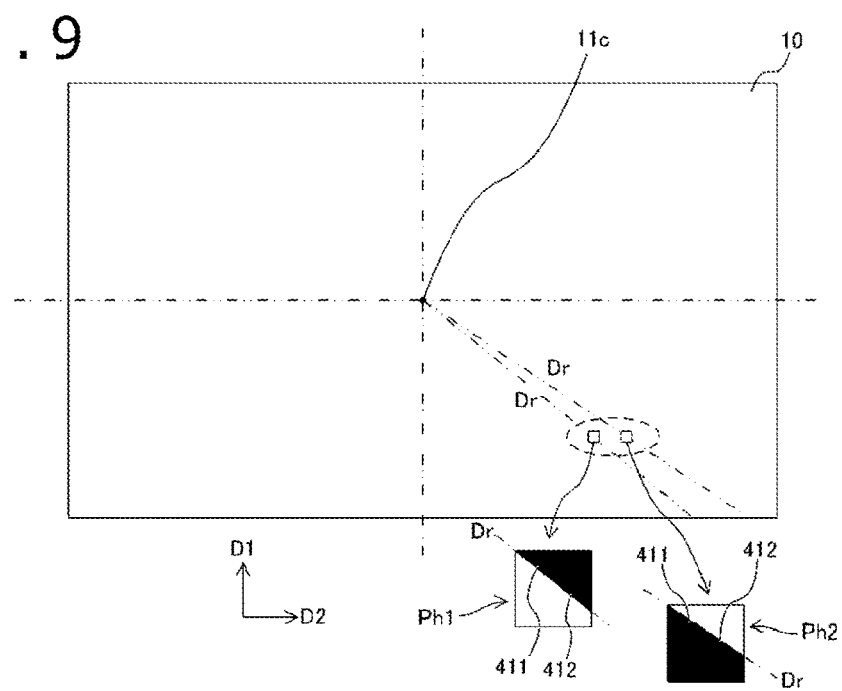
FIG. 9 is a diagram describing the first edge portions and the second edge portions in the edge portions of the light shielding portions.

In the light shielding portions 40 of the pixels Ph1 and Ph2 depicted in FIG. 9, the edge portions 41 are formed across the pixels Ph1 and Ph2 along the radiation ray Dr from the optical axis center 11c of the light receiving surface 10 of the solid-state imaging device 100. Note that the edge portions 41 depicted in FIG. 9 may also be formed in zigzags with combinations of direction lines different from the radiation ray Dr as in the examples depicted in FIGS. 7 and 8. The first edge portions 411 and the second edge portions 412 are separately provided on the edge portions 41 extending along the radiation ray Dr.

Note that when the edge portion 41 is formed along the radiation ray Dr as in the light shielding portion 40 of the pixel Ph depicted in FIG. 9, the edge portion 41 may extend in the first direction D1 or the second direction D2, and in this case, the first edge portion 411 and the second edge portion 412 may be provided at the same positions in the first direction D1 or the second direction D2. Further, when the edge portion 41 extends in the first direction D1 or the second direction D2, the edge portion 41 does not have to be formed in a zigzag with a combination of direction lines different from the radiation ray Dr.

Figure 10:
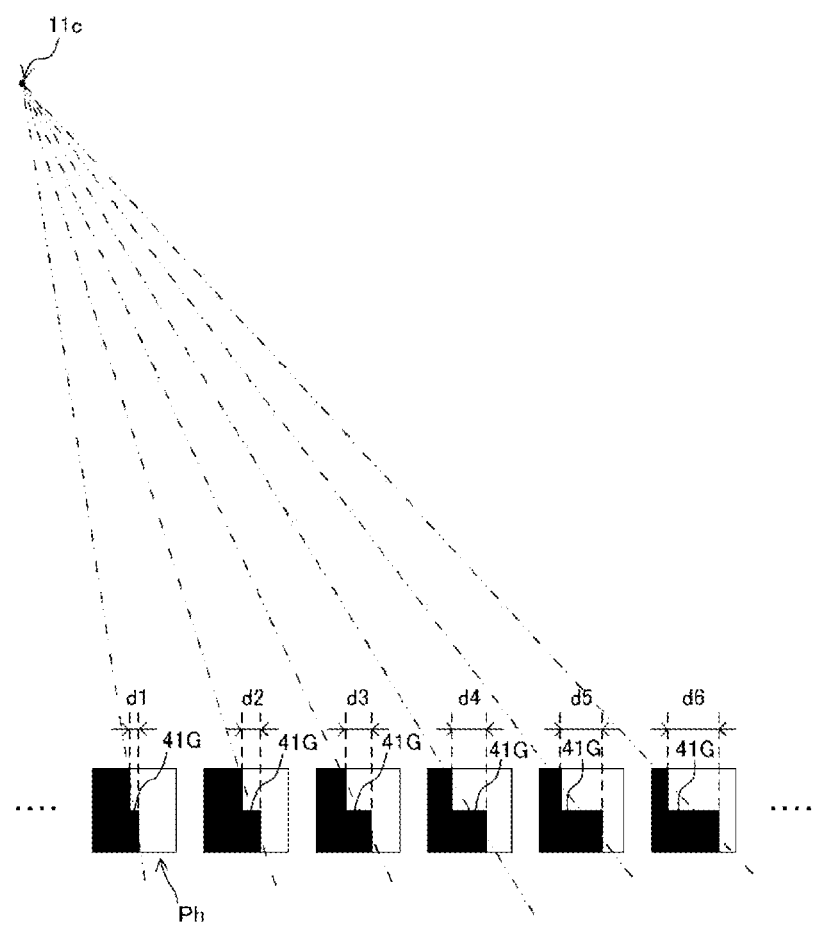
FIG. 10 is a diagram describing the first edge portions and the second edge portions in the edge portions of the light shielding portions.

FIG. 10 is a diagram comparing, in the solid-state imaging device 100, step widths of the pixels Ph including the stepped portions 41G in the edge portions 41. FIG. 10 depicts a state in which the plurality of pixels Ph are arranged in a line.

In the plurality of pixels Ph, the step widths of the stepped portions 41G gradually increase according to the degree of separation from the optical axis center 11c of the light receiving surface 10. More specifically, the step widths of the stepped portions 41G are d1, d2, d3, d4, d5, and d6 in ascending order of the distance from the optical axis center to the pixel Ph, and the step widths have a magnitude relation of d1<d2<d3<d4<d5<d6.

Figure 11:
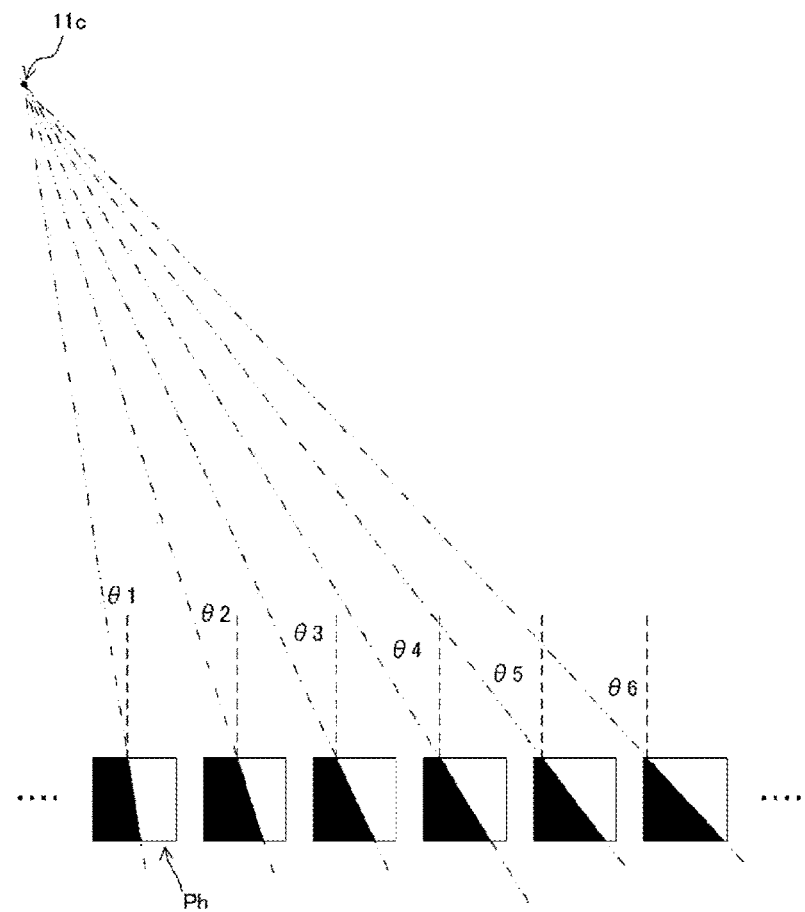
FIG. 11 is a diagram describing the first edge portions and the second edge portions in the edge portions of the light shielding portions.

FIG. 11 is a diagram comparing, in the solid-state imaging device 100, inclination angles of the pixels Ph with inclinations on the edge portions 41. FIG. 11 depicts a state in which the plurality of pixels Ph are arranged in a line. The inclination angles of the plurality of pixels Ph gradually increase according to the degree of separation from the optical axis center 11c of the light receiving surface 10. More specifically, the inclination angles are θ1, θ2, θ3, θ4, θ5, and θ6 in ascending order of the distance from the optical axis center to the pixel Ph, and the step widths have a magnitude relation of θ1<θ2<θ3<θ4<θ5<θ6.

There are two types of pixels Ph depicted in FIGS. 3 to 11, the pixel Ph1 and the pixel Ph2 ((a) and (b) in the examples depicted in FIGS. 3 to 8) having shapes rotated 180° from each other with the pixel center as the axis of point symmetry. More specifically, there are two types of pixels Ph: the pixel Ph1 with one side shielded and the other side opened across the edge portion 41; and the pixel Ph2 with one side opened and the other side shielded across the edge portion 41.

As for the positional relation between the pixel Ph1 and the pixel Ph2, at least one pixel Ph2 is disposed within a certain range from the pixel Ph1, and at least one pixel Ph1 is disposed within a certain range from the pixel Ph2. The certain range is about one to several pixels and is a close range that allows assuming that the chief ray angles of the incident light entering the pixels are substantially equal. Therefore, an imaging apparatus 200 described later can compare light reception results of the pixel Ph1 and the pixel Ph2 within the certain range from the pixel Ph1 to perform focus determination.

Figure 12:
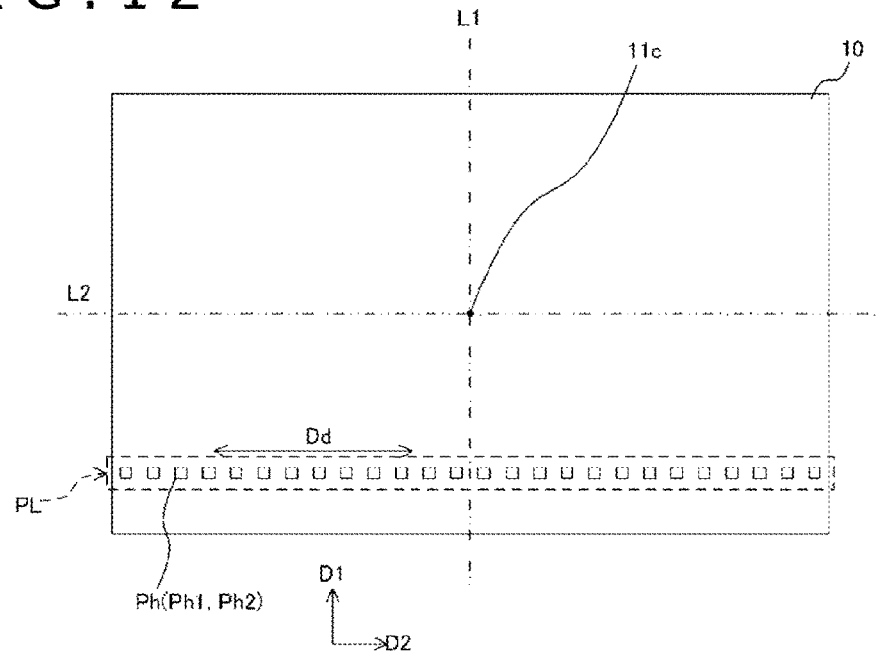
FIG. 12 is a diagram describing positions and arrangement direction of pixels including the light shielding portions on the solid-state imaging device.

FIG. 12 is a diagram describing positions and arrangement direction of the pixels Ph including the light shielding portions 40 depicted in FIGS. 3 to 8 on the solid-state imaging device 100.

The pixels Ph depicted in FIGS. 3 to 8 are mainly provided at a corner section of the light receiving surface 100 of the solid-state imaging device 100. In the example depicted in FIG. 10, the corner section denotes a pixel area excluding pixels intersecting with a first line L1, which passes through the optical axis center 11c and extends in the first direction D1, and a second line L2, which passes through the optical axis center 11c and extends in the second direction D2. Note that this is not intended to prohibit providing the pixels Ph at a section intersecting with the first line L1 or the second line L2. On the other hand, the pixels Ph depicted in FIG. 9 can be provided at arbitrary positions on the light receiving surface 10 including positions on the first line L1 and positions on the second line L2.

The pixels Ph are separately or continuously lined up and arranged in a wave detection direction Dd appropriately selected by the imaging apparatus 200 described later. In the example depicted in FIG. 12, the second direction D2 corresponding to the left and right direction in the output image of the solid-state imaging device 100 is the wave detection direction Dd, and a phase difference detection pixel group PL including the plurality of pixels Ph lined up and arranged in the wave detection direction Dd is provided. In the phase difference detection pixel group PL, the pixels Ph1 and the pixels Ph2 are provided in substantially equal proportions as a whole, and for example, the pixels Ph1 and the pixels Ph2 are alternately provided.

The solid-state imaging device 100 described above can be realized in various specific modes, and an example of the specific modes will be described below.

Figure 13:
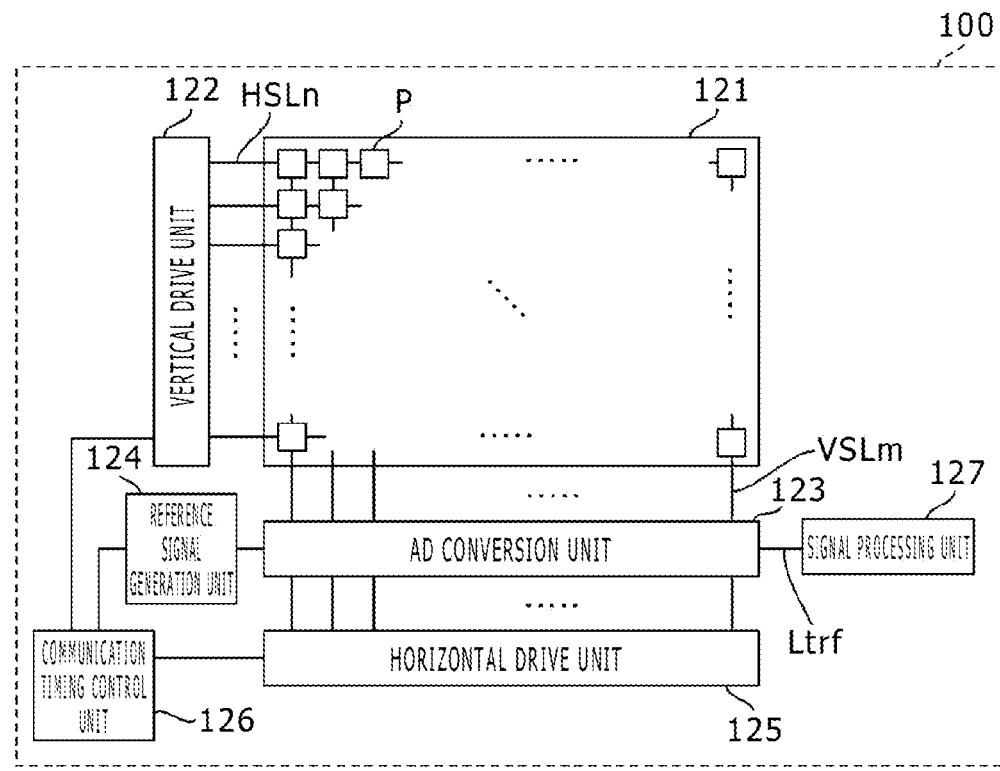
FIG. 13 is a block diagram depicting a configuration of a solid-state imaging apparatus.

FIG. 13 is a block diagram depicting a configuration of the solid-state imaging device 100. Note that, although a CMOS (Complementary Metal Oxide Semiconductor) image sensor that is a kind of an X-Y address type solid-state imaging device will be described as an example of the solid-state imaging device in the present embodiment, it is obvious that a CCD (Charge Coupled Device) image sensor may be adopted. A specific example of the solid-state imaging device as a CMOS image sensor will be described with reference to FIG. 13.

In FIG. 13, the solid-state imaging device 100 includes a pixel unit 121, a vertical drive unit 122, an analog digital conversion unit 123 (AD conversion unit 123), a reference signal generation unit 124, a horizontal drive unit 125, a communication timing control unit 126, and a signal processing unit 127.

The plurality of pixels P including photodiodes as photoelectric conversion units are arranged in a two-dimensional matrix on the pixel unit 121. The photodiodes generate electrical signals according to the amounts of received light. A color filter array with colors of filters divided according to the pixels is provided on a light receiving surface side of the pixel unit 121.

On the pixel unit 121, n pixel drive lines HSLn (n=1, 2, . . . ) and m vertical signal lines VSLm (m=1, 2, . . . ) are wired. The pixel drive lines HSLn are wired in the left and right direction of the figure (pixel arrangement direction of pixel rows, or horizontal direction) and are arranged at equal intervals in the up and down direction of the figure. The vertical signal lines VSLm are wired in the up and down direction of the figure (pixel arrangement direction of pixel columns, or vertical direction) and are arranged at equal intervals in the left and right direction of the figure.

One end of the pixel drive line HSLn is connected to an output terminal corresponding to each row of the vertical drive unit 122. The vertical signal line VSLm is connected to the pixel P of each column, and one end of the vertical signal line VSLm is connected to the AD conversion unit 123. Under the control of the communication timing control unit 126, the vertical drive unit 122 and the horizontal drive unit 125 perform control of sequentially reading, from the pixels P included in the pixel unit 121, analog electrical signals generated by photodiodes PD according to the amounts of received light.

The communication timing control unit 126 includes, for example, a timing generator and a communication interface. The timing generator generates various clock signals based on a clock (master clock) input from the outside. The communication interface receives data for instructing an operation mode or the like provided from the outside of the solid-state imaging device 100 and outputs data including internal information of the solid-state imaging device 100 to the outside.

Based on the master clock, the communication timing control unit 126 generates a clock at the same frequency as the master clock, a clock obtained by dividing the frequency by two, a low-speed clock obtained by further dividing the frequency, and the like and supplies the clocks to the units in the device (such as vertical drive unit 122, horizontal drive unit 125, AD conversion unit 123, reference signal generation unit 124, and signal processing unit 127).

The vertical drive unit 122 is constituted by, for example, a shift register and an address decoder. The vertical drive unit 122 includes a vertical address setting unit that controls row addresses and a row scanning control unit that controls row scanning based on a decoded signal of a video signal input from the outside.

The vertical drive unit 122 can perform read scanning and sweep scanning.

The read scanning is a scan for sequentially selecting unit pixels from which the signals will be read. Although the read scanning is basically performed row by row, the read scanning is performed in a predetermined order when the pixels are reduced based on a sum or arithmetic means of the outputs of a plurality of pixels in a predetermined positional relation.

The sweep scanning is a scan performed for a row or a combination of pixels to be read in the read scanning, in which a unit pixel belonging to the row or the combination of pixels to be read is reset earlier than the read scanning by a time period equivalent to the shutter speed.

The horizontal drive unit 125 sequentially selects ADC circuits constituting the AD conversion unit 123 in synchronization with the clock output by the communication timing control unit 126. The AD conversion unit 123 includes ADC circuits provided for the respective vertical signal lines VSLm (m=1, 2, . . . ). The AD conversion unit 123 converts analog signals output from the vertical signal lines VSLm into digital signals and outputs the digital signals to a horizontal signal line Ltrf according to the control by the horizontal drive unit 125.

The horizontal drive unit 125 includes, for example, a horizontal address setting unit and a horizontal scan unit. The horizontal drive unit 125 selects individual ADC circuits of the AD conversion unit 123 corresponding to read columns in the horizontal direction defined by the horizontal address setting unit to guide the digital signals generated by the selected ADC circuits to the horizontal signal line Ltrf.

The digital signals output from the AD conversion unit 123 in this way are input to the signal processing unit 127 through the horizontal signal line Ltrf. The signal processing unit 127 executes a process of converting the signals output from the pixel unit 121 through the AD conversion unit 123 into image signals corresponding to the color arrangement of the color filter array in a calculation process.

The signal processing unit 127 also executes a process of using a sum, arithmetic means, or the like to reduce the pixel signals in the horizontal direction or the vertical direction as necessary. The image signals generated in this way are output to the outside of the solid-state imaging device 100.

The reference signal generation unit 124 includes a DAC (Digital Analog Converter) and generates a reference signal Vramp (see FIG. 4 and the like described later) in synchronization with a count clock supplied from the communication timing control unit 126. The reference signal Vramp is a sawtooth wave (ramp waveform) that changes with time in a step-wise manner from an initial value supplied from the communication timing control unit 126. The reference signal Vramp is supplied to the individual ADC circuits of the AD conversion unit 123.

The AD conversion unit 123 includes a plurality of ADC circuits. When the ADC circuit performs AD conversion of an analog voltage output from each pixel P, a comparator compares the reference signal Vramp and the voltage of the vertical signal line VSLm in a predetermined AD conversion period (P-phase period or D-phase period described later), and a counter counts the time before or after the inversion of the magnitude relation between the reference signal Vramp and the voltage (pixel voltage) of the voltage of the vertical signal line VSLm. As a result, a digital signal corresponding to the analog pixel voltage can be generated. Note that a specific example of the AD conversion unit 123 will be described later.

Figure 14:
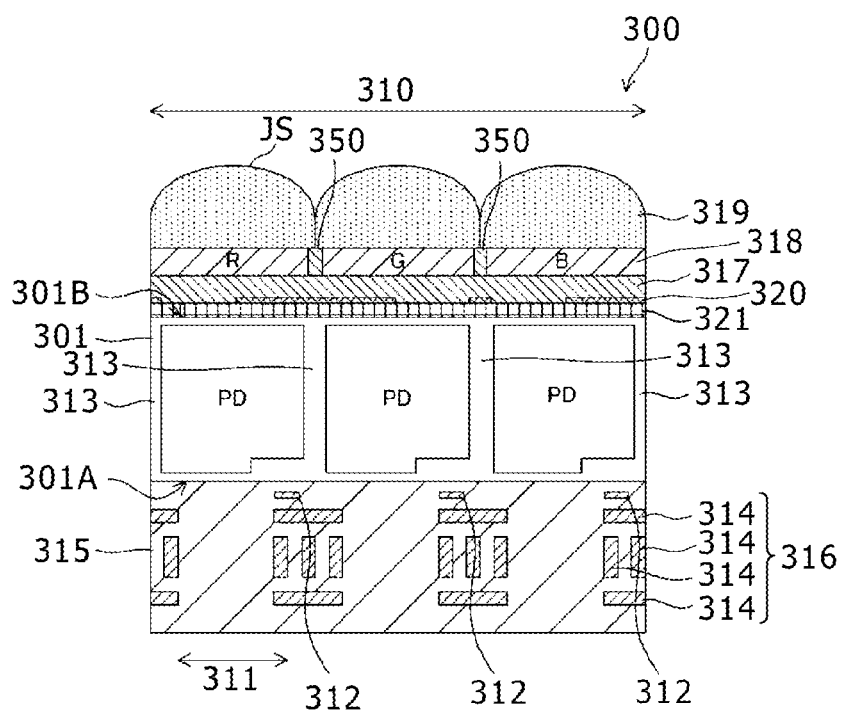
FIG. 14 is a cross-sectional diagram of a structure of main parts of a back-side illuminated solid-state imaging device.

FIG. 14 is a cross-sectional diagram of a structure of main parts of a back-side illuminated solid-state imaging device 300. Note that, although an example of a back-side illuminated CMOS image sensor will be described in the present embodiment, it is obvious that the image sensor is not limited to this, and the present embodiment can also be applied to a front-side illuminated CMOS image sensor and a back-side illuminated or front-side illuminated CCD image sensor.

Further, the structure of the solid-state imaging device 300 described later is an example, and the light condensing structure is not limited to the structure. Furthermore, for example, a lens in layer for increasing the light condensing power, a light shielding wall provided between the pixels from an interlayer insulating film 321 to a color filter layer 318 to prevent mixed colors or flare, and the like may be combined.

The solid-state imaging device 300 depicted in the figure is a back-side illuminated CMOS image sensor and is provided with, for example: a pixel region 310 (so-called imaging region) including a plurality of unit pixels 311 arranged on a semiconductor substrate 301 made of silicon; and a peripheral circuit unit (not depicted) arranged around the pixel region 310.

Pixel transistors are formed on the side of a substrate front surface 301A, and gate electrodes 312 are illustrated in FIG. 14 to schematically indicate the existence of the pixel transistors. The photodiodes PD are isolated by device isolation regions 313 made of an impurity diffusion layer.

On the front surface side provided with the pixel transistors of the semiconductor substrate 301, a multilayer wiring layer 316 provided with a plurality of wires 314 is formed through an interlayer insulating film 315. Therefore, the wires 314 can be formed regardless of the positions of the photodiodes PD in the back-side illuminated CMOS image sensor.

The interlayer insulating film 321 that functions as a reflection prevention film is formed on a back surface 301B facing the photodiodes PD of the semiconductor substrate 301. The interlayer insulating film 321 has a laminate structure in which a plurality of films with different refractive indices are laminated.

The interlayer insulating film 321 is constituted by, for example, a two-layer structure including a hafnium oxide ($HfO_2$) film and a silicon oxide film ($SiO_2$) sequentially laminated from the side of the semiconductor substrate 301. The hafnium oxide film is a high dielectric insulating layer (high-k film) with a dielectric constant higher than the silicon oxide film. Alternatively, a silicon nitride film may be used for the interlayer insulating film 321.

A light shielding film 320 is formed on the interlayer insulating film 321. The light shielding film 320 can be made of a material that blocks light, and the light shielding film 320 is preferably formed by a material with a high light shielding property that can be microfabricated, such as a material that can be accurately processed by etching. More specifically, examples of the material include aluminum (Al), tungsten (W), and copper (Cu). The light shielding film 320 is equivalent to the light shielding portion 40 of the above-described solid-state imaging device 100. Note that, in the case of a front-side illuminated image sensor, a wiring layer provided between the photodiodes and the color filter layer may be used in place of the light shielding film 320 to constitute the light shielding portion 40.

A planarization film 317 is formed as necessary on the interlayer insulating film 321 and the light shielding film 320, and the color filter layer 318 including a plurality of color filters formed to correspond to the respective positions of the photodiodes PD is formed on the planarization film 317. Note that the planarization film 317 may not be formed if the difference in level of the upper surfaces of the interlayer insulating film 321 and the planarization film 317 can be accepted.

Microlenses 319 corresponding to the respective photodiodes PD are formed on the upper surface of the color filter layer 318. The microlenses 319 are provided on the back surface of the semiconductor substrate 301 and above the light shielding film 320 as depicted in FIG. 14. The plurality of microlenses 319 in the same shape are arranged to correspond to the plurality of photodiodes PD arranged in the pixel region 310. The microlens 319 is a convex lens in which the center is formed thicker than the edges in a direction from a light receiving surface JS toward the color filter layer 318.

(B) Second Embodiment

Figure 15:
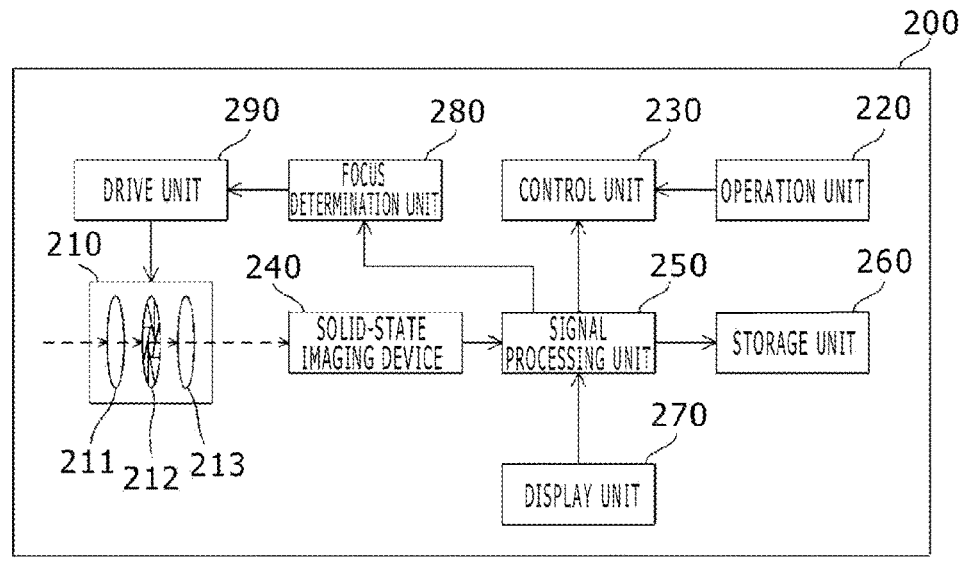
FIG. 15 is a diagram describing an example of a functional configuration of an imaging apparatus according to a second embodiment.

Next, the imaging apparatus 200 including the solid-state imaging device according to the above-described first embodiment will be described. FIG. 15 is a diagram describing an example of a functional configuration of the imaging apparatus according to the present embodiment.

The imaging apparatus 200 is an imaging apparatus that images a subject to generate image data (captured image) and that records the generated image data as image content (still image content or video content). Note that an example of recording still image content (still image file) as image content (image file) will be mainly illustrated.

The imaging apparatus 200 includes a lens unit 210, an operation unit 220, a control unit 230, a solid-state imaging device 240, a signal processing unit 250, a storage unit 260, a display unit 270, a focus determination unit 280, and a drive unit 290. The solid-state imaging device 240 is constituted by the solid-state imaging device 100 according to the first embodiment described above.

The lens unit 210 condenses light from the subject (subject light). The lens unit 210 includes, for example, a zoom lens 211, a diaphragm 212, a focus lens 213, and a lens control unit 214 (not depicted).

The lens unit 210 can be interchanged in the present embodiment, and an example of a case in which a first lens unit 210A and a second lens unit 210B are interchangeable will be described as necessary. Note that the number of interchangeable lens units may be two or more, and in that case, the number of edge portions divided by the above-described stepped portions 41G is increased according to the number of chief ray angles of the incident light entering the pixels (or the number of groups of a plurality of lenses or zoom positions with similar properties of chief ray angle). Note that it is assumed that the case in which the first lens unit 210A is installed on the imaging apparatus 200 and the case in which the second lens unit 210B is installed on the imaging apparatus 200 have different chief ray incident angles of the light entering the pixels.

The drive unit 290 drives the zoom lens 211 to move the zoom lens 211 in the optical axis direction to change the focal length, and the zoom lens 211 changes the magnification of the subject included in the captured image. The drive unit 290 drives the diaphragm 212 to change the degree of opening, and the diaphragm 212 adjusts the amount of subject light entering the solid-state imaging device 240. The drive unit 290 drives the focus lens 213 to move the focus lens 213 in the optical axis direction, and the focus lens 213 adjusts the focus of the light incident on the solid-state imaging device 240.

The operation unit 220 receives an operation from the user. When, for example, a shutter button is pressed and operated, the operation unit 220 supplies the control unit 230 with an operation signal that is a signal corresponding to the pressing operation.

The control unit 230 controls the operation of each unit constituting the imaging apparatus 200. For example, when the focus determination is to be performed by a phase difference detection system, the control unit 230 supplies the signal processing unit 250 with a signal (phase difference detection operation signal) indicating an operation of performing the focus determination (phase difference detection operation). The phase difference detection system is a focus detection method, in which the light passing through the imaging lens is pupil-divided to form a pair of images, and the interval between the formed images (amount of deviation between the images) is measured (phase difference is detected) to detect the degree of focus.

The solid-state imaging device 240 receives the subject light and photoelectrically converts the received subject light into an electrical signal.

The solid-state imaging device 240 is provided with pixels (image generation pixels) that generate signals for generating the captured image based on the received subject light and pixels (phase difference detection pixels) that generate signals for performing phase difference detection. The solid-state imaging device 240 supplies the signal processing unit 250 with the electrical signal generated by the photoelectric conversion.

The signal processing unit 250 applies various types of signal processing to the electrical signal supplied from the solid-state imaging device 240. When, for example, a still image imaging operation signal is supplied from the control unit 230, the signal processing unit 250 applies various types of signal processing to generate data of a still image (still image data). The signal processing unit 250 supplies the generated image data to the storage unit 260 and causes the storage unit 260 to store the image data.

When a phase difference detection operation signal is supplied from the control unit 230, the signal processing unit 250 generates data for detecting the phase difference (phase difference detection data) based on the output signals from the phase difference detection pixels of the solid-state imaging device 240. The signal processing unit 250 supplies the generated phase difference detection data to the focus determination unit 280.

When a live view display signal is supplied from the control unit 230, the signal processing unit 250 generates data of a live view image (live view image data) based on the output signals from the image generation pixels in the solid-state imaging device 240. The signal processing unit 250 supplies the generated live view image data to the display unit 270.

The storage unit 260 records image content (image file) that is the image data supplied from the signal processing unit 250. A semiconductor memory or other removable recording media or built-in recording media can be used as the storage unit 260, for example.

The display unit 270 displays the image on a display screen based on the image data supplied from the signal processing unit 250. The display unit 270 is realized by, for example, a liquid crystal panel. The display unit 270 displays a live view image on the display screen when, for example, the live view image data is supplied from the signal processing unit 250.

The focus determination unit 280 determines whether or not the object to be focused (focusing target) is focused based on the phase difference detection data supplied from the signal processing unit 250.

When the object (focusing target) in a region for focusing (focus area) is focused, the focus determination unit 280 supplies the drive unit 290 with focus determination result information that is information indicating that the focusing target is focused.

When the focusing target in the focus area is not focused, the focus determination unit 280 calculates an amount of deviation of focus (amount of defocus) and supplies the drive unit 290 with focus determination result information that is information indicating the calculated amount of defocus.

Figure 16:
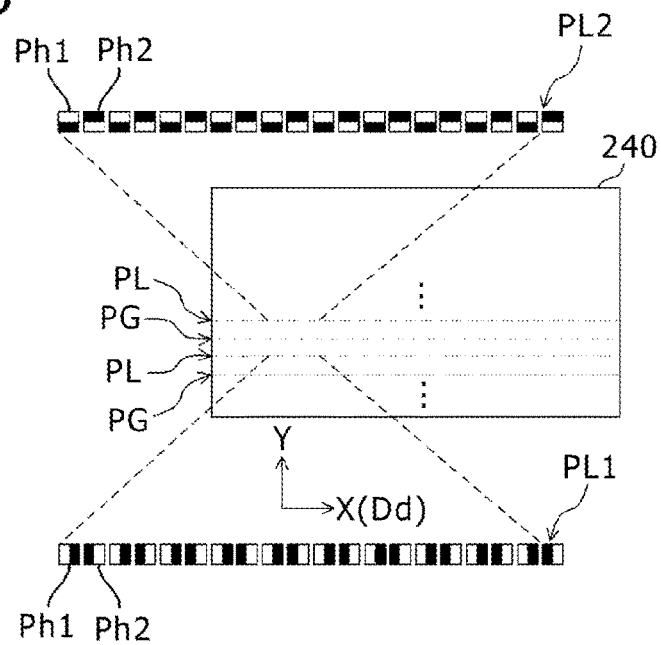
FIG. 16 is a schematic diagram depicting an example of pixel arrangement in a solid-state imaging device.

Here, an example of the calculation of the amount of defocus will described. FIG. 16 is a schematic diagram depicting an example of pixel arrangement in the solid-state imaging device 240. In this figure, the up and down direction will be referred to as a Y axis, and the left and right direction will be referred to as an X axis. The reading direction of the signal in the solid-state imaging device 240 will be referred to as an X-axis direction (signal is read row by row). In the present embodiment, the wave detection direction Dd is the X-axis direction.

In the solid-state imaging device 240, rows provided with the image generation pixels and rows provided with the phase difference detection pixels are alternately arranged. In the example depicted in FIG. 16, the phase difference detection pixel group PL, an image generation pixel group PG, the phase difference detection pixel group PL, the image generation pixel group PG, . . . including the pixels constituting the pixel groups lined up in the X-axis direction are alternately arranged in the Y-axis direction.

In the solid-state imaging device 240, lines PL1 and lines PL2 are alternately arranged across the image generation pixel groups PG, in which the pixels Ph1 with openings on the left sides of the edge portions 41 and the pixels Ph2 with openings on the right sides of the edge portions 41 are alternately arranged in the lines PL1, and the pixels Ph1 with openings on the upper sides of the edge portions 41 and the pixels Ph2 with openings on the lower sides of the edge portions 41 are alternately arranged in the lines PL2. More specifically, the phase difference detection pixels for performing the pupil division in the same direction (reading direction (left and right) or direction orthogonal to the reading direction (up and down)) are arranged row by row in the phase difference detection pixel group PL.

Figure 17:
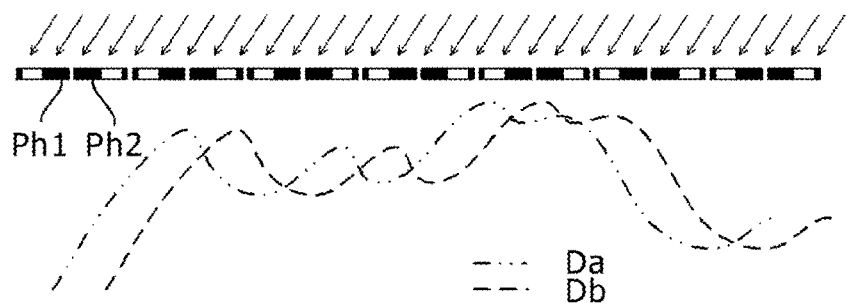
FIG. 17 is a diagram describing received light data obtained from phase difference detection pixels.

FIG. 17 is a diagram describing received light data obtained from the pixels Ph. This figure depicts received light data obtained from the line PL1. The layout direction of the line PL1 is equivalent to the wave detection direction Dd. Hereinafter, received light data obtained from the pixels Ph1 in the received light data obtained from the line PL1 will be referred to as received light data Da, and received light data obtained from the pixels Ph2 will be referred to as received light data Db.

Comparing the received light data Da and the received light data Db, data series of the received light data Da and data series of the received light data Db have substantially similar waveforms and have shapes offset from each other in the wave detection direction Dd at the phase difference corresponding to the amount of defocus. The larger the amount of defocus, the larger the amount of phase difference (amount of horizontal deviation) between the data series of the received light data Da and the data series of the received light data Db.

The amount of phase difference between the data series of the received light data Da and the data series of the received light data Db can be calculated by various operations, and for example, the amount of phase difference can be calculated based on the difference between the centers of gravity of the received light data. The distance to the subject can be calculated based on the amount of phase difference. Note that the amount of phase difference can also be obtained by calculating the correlation between the data series of the received light data Da and the data series of the received light data Db. Various well-known methods or methods developed in the future can be adopted to obtain the evaluation value of the amount of correlation between the data series of the received light data Da and the data series of the received light data Db.

For example, there is a method of shifting one of the waveform data (curves) on a pixel-by-pixel basis to calculate the sum of the differences between the curve and the other curve and obtaining the amount of phase difference from the distance where the sum is the smallest. More specifically, integrated values of the absolute values of the differences between the points constituting the received light data Da and the points constituting the received light data Db are obtained, and the difference between the points where the integrated value is the smallest is set as the amount of phase difference. Hereinafter, the smallest integrated value will be referred to as a correlation value. The higher the correlation between the received light data Da and the received light data Db, the smaller the smallest value of the correlation value.

The amount of offset and the amount of defocus of the data series of the received light data Da and the data series of the received light data Db have a proportional relation, and a proportionality factor of the proportional relation can be acquired in advance in a factory test or the like.

The focus determination unit 280 calculates the amount of defocus from the amount of phase difference between the data series of the received light data Da and the data series of the received light data Db and provides an amount of drive equivalent to the calculated amount of defocus to the drive unit 290. Note that the relation between the amount of defocus and the amount of drive of the focus lens 213 is uniquely determined by design values of the lens unit 210 installed on the imaging apparatus 200.

The drive unit 290 drives the zoom lens 211, the diaphragm 212, and the focus lens 213 constituting the lens unit 210.

The drive unit 290 calculates the amount of drive of the focus lens 213 based on, for example, the focus determination result information output from the focus determination unit 280 and moves the focus lens 213 according to the calculated amount of drive. In this way, the auto focus (AF) control is executed, in which the focus lens 213 is moved to the focus position detected by the focus determination unit 280.

When the object is focused, the drive unit 290 maintains the current position of the focus lens 213. When the focus is deviated, the drive unit 290 calculates the amount of drive (moving distance) based on the focus determination result information indicating the amount of defocus and the position information of the focus lens 213 and moves the focus lens 213 according to the amount of drive.

Figure 18:
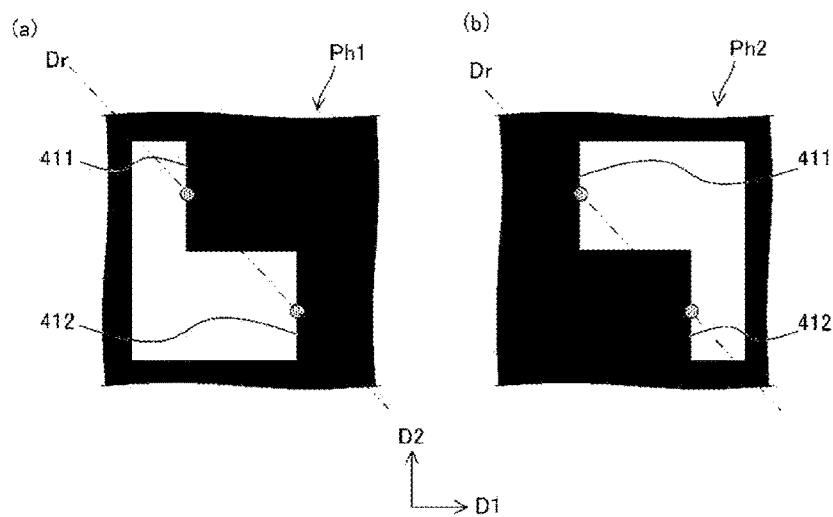
FIG. 18 is a diagram describing imaging positions during focusing in the phase difference detection pixels.

FIG. 18 is a diagram describing imaging positions during focusing in the pixels Ph. The example of this figure illustrates a case in which two types of different chief ray angles are switched and used regarding the incident light entering the pixels (when the first lens unit 210A and the second lens unit 210B are interchanged and used or when the zoom position is switched and used). For example, when the first lens unit 210A and the second lens unit 210B are interchanged and used, the positions of the first edge portion 411 and the second edge portion 412 are adjusted in the pixels Ph1 and Ph2, such that the light is condensed near the first edge portion 411 when the first lens unit 210A is used for focusing, and the light is condensed near the second edge portion 412 when the second lens unit 210B is used for focusing. This allows to use the same phase difference detection pixel groups PL to perform the focus determination of two types of lens units with different chief ray angles or two types of zoom positions with different chief ray angles.

Figure 19:
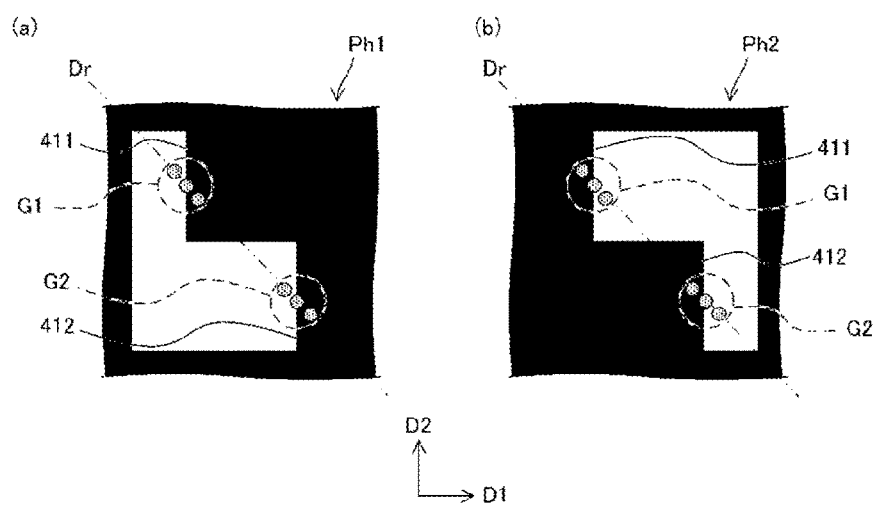
FIG. 19 is a diagram describing imaging positions during focusing in the phase difference detection pixels.

FIG. 19 is a diagram describing imaging positions during focusing in the pixels Ph. The example of this figure illustrates a case in which three or more different chief ray angles are switched and used regarding the incident light entering the pixels (when a plurality of types of lens units are interchanged and used or when a plurality of zoom positions are switched and used). In this case, the positions of the first edge portion 411 and the second edge portion 412 are adjusted in the pixels Ph1 and Ph2, such that the light is condensed near the first edge portions 411 when the lens units or the zoom positions (first chief ray angle group G1) with chief ray angles within a certain range from a first chief ray angle are used for focusing, and the light is condensed near the second edge portions 412 when the lens units or the zoom positions (second chief ray angle group G2) with chief ray angles within a certain range from a second chief ray angle are used for focusing. This allows to use the same phase difference detection pixel groups PL to perform the focus determination of a plurality of types of lens units or zoom positions belonging to the first chief ray angle group G1 and the second chief ray angle group G2.

Figure 20:
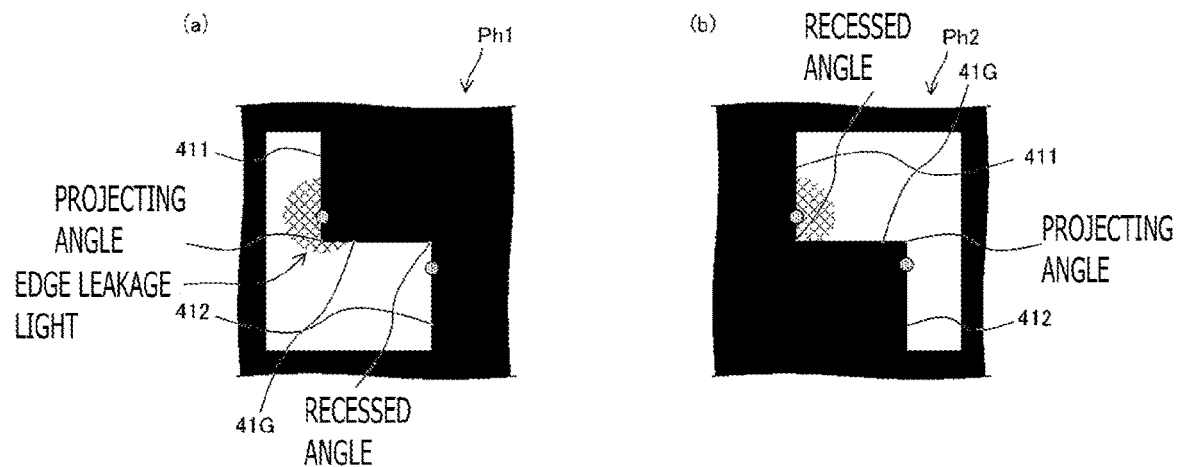
FIG. 20 is a diagram describing influence on received light intensity caused by installation of a stepped portion.

FIG. 20 is a diagram describing influence on the received light intensity caused by the installation of the stepped portion 41G on the midway of the edge portion 41.

As in the pixel Ph1 depicted in FIG. 20(a), when the light is condensed on the first edge portion 411 adjacent to the projecting angle of the stepped portion 41G, part of the light that would be cut by the light shielding portion 40 without the stepped portion 41G excessively enters the photodiode PD as edge leakage light from the stepped portion 41G. On the other hand, when the light is condensed adjacent to the recessed angle of the stepped portion 41G as in the pixel Ph2 depicted in FIG. 20(b), the light shielding portion 40 excessively cuts part of the light that would enter the photodiode PD without the stepped portion 41G.

Therefore, the imaging apparatus 200 according to the present embodiment is provided with a configuration for using calculation to adjust and remove the influence of the excessive edge leakage light components when the light is condensed on the edge portion adjacent to the projecting angle of the stepped portion 41G and the influence of the excessive light shielding components when the light is condensed on the edge portion adjacent to the recessed angle of the stepped portion 41G.

Specifically, for the received light data obtained from the pixel that condenses the light at the edge portion adjacent to the projecting angle of the stepped portion 41G, a predetermined amount is subtracted from the signal intensity, and then the amount of phase difference is calculated. For the received light data obtained from the pixel that condenses the light at the edge portion adjacent to the recessed angle of the stepped portion 41G, a predetermined amount is added to the signal intensity, and then the amount of phase difference is calculated. The amount of subtraction and the amount of addition are set in advance by actual measurement, simulation, or the like. Obviously, the method of adjusting the signal intensity can be appropriately changed, and the subtraction or the addition may be performed by adding the amount of addition or the amount of subtraction of one of the received light data to the other received light data.

(C) Third Embodiment

Hereinafter, an example of a manufacturing method for manufacturing the solid-state imaging device 300 will be described. FIGS. 21 to 26 are diagrams depicting main parts of the solid-state imaging device 300 in steps of the manufacturing method of the solid-state imaging device 300. Note that the manufacturing method of the above-described backside illuminated CMOS image sensor is illustrated in the present embodiment.

Figure 21:
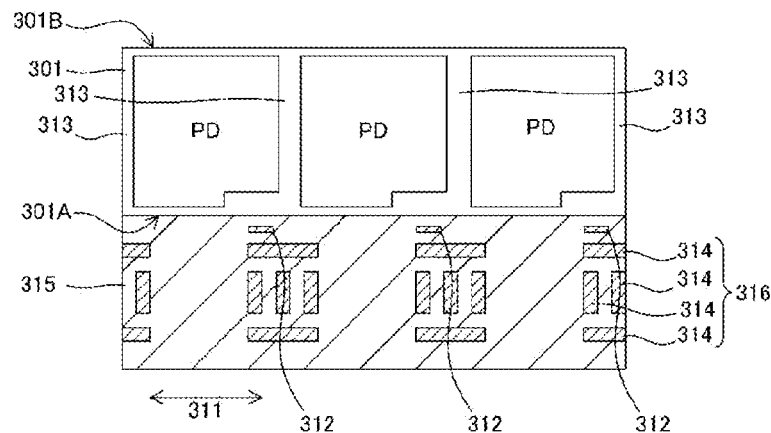
FIG. 21 is a diagram depicting main parts of a solid-state imaging device in each step of a manufacturing method of the solid-state imaging device.

First, a first step is performed as depicted in FIG. 21, in which the photodiodes PD as photoelectric conversion units are formed in accordance with the pixels in the regions for forming the pixel regions of the semiconductor substrate 301.

The photodiodes PD have pn junctions including: n-type semiconductor regions throughout the entire region in the substrate thickness direction; and p-type semiconductor regions formed in contact with the n-type semiconductor regions and facing both the front and back sides of the substrate. The p-type semiconductor regions and the n-type semiconductor regions are formed by, for example, using an ion implantation method to introduce impurities to the semiconductor substrate. The photodiodes PD are isolated by device isolation regions formed by p-type semiconductors.

In regions corresponding to the pixels of the substrate front surface 301A, p-type semiconductor well regions contacting the respective device isolation regions are formed, and pixel transistors are formed in the respective p-type semiconductor well regions. The pixel transistors are each formed by a source region, a drain region, a gate insulating film, and the gate electrode 312. Furthermore, the multilayer wiring layer 316 including the wires 314 with a plurality of layers provided through the interlayer insulating film 315 is formed on the upper part of the substrate front surface 301A.

Figure 22:
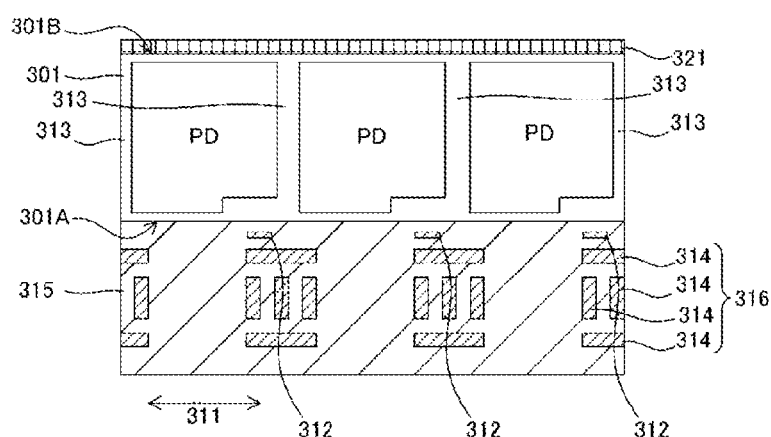
FIG. 22 is a diagram depicting main parts of the solid-state imaging device in each step of the manufacturing method of the solid-state imaging device.

Next, as depicted in FIG. 22, the interlayer insulating film 321 that functions as a reflection prevention film is formed on the substrate back surface 301B serving as the light receiving surface. The interlayer insulating film 321 can be formed by, for example, a two-layer film including a silicon oxide film ($SiO_2$) and a hafnium oxide film ($HfO_2$) sequentially laminated from the back surface side of the semiconductor substrate 301. The hafnium oxide film is formed at a thickness optimal for preventing reflection. The interlayer insulating film 321 is formed by, for example, a thermal oxidation method or a CVD (Chemical Vapor Deposition) method.

Figure 23:
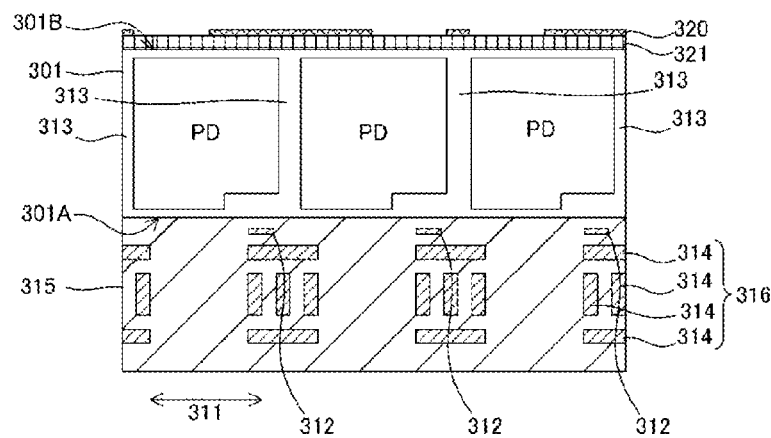
FIG. 23 is a diagram depicting main parts of the solid-state imaging device in each step of the manufacturing method of the solid-state imaging device.

Next, as depicted in FIG. 23, the light shielding film 320 is formed on the substrate back surface 301B of the semiconductor substrate 301 through the interlayer insulating film 321. Specifically, the light shielding film 320 is formed by performing a deposition step of depositing a light shielding film on the entire surface of the interlayer insulating film 321 and a pattern processing step of processing the pattern by etching the light shielding film. Note that, although the light shielding film 320 may be independently formed, the light shielding film 320 may be formed at the same time as the peripheral circuits or the light shielding films on the pixels that determine the optical black level.

Preferably, the material of the light shielding film 320 has a high light shielding property, and the material is suitable for delicate processing that can be accurately processed by, for example, etching. Examples of the material with such characteristics include metal materials such as aluminum (Al), tungsten (W), titanium (Ti), and copper (Cu).

The deposition step of the light shielding film 320 is performed by, for example, a sputtering method, a CVD (Chemical Vapor Deposition) method, or a plating process. As a result, the metal film of aluminum or the like is formed on the entire surface of the interlayer insulating film 321.

In the pattern processing step of the light shielding film 320, a resist mask is formed along a part corresponding to the boundary between the image generation pixels. As for the phase difference detection pixels, a resist mask is formed at a part corresponding to the boundary between the pixels and on one of the sides shielded across the edge portion 41. The light shielding film 320 of the part not provided with the resist mask is selectively etched and removed by etching, such as wet etching and dry etching.

As a result, the light shielding film 320 is formed along the boundary lines of the image generation pixels adjacent to each other, and a pattern with openings at the parts of the light receiving surfaces of the photodiodes PD is formed. On the other hand, the light shielding film 320 is similarly formed along the boundary lines of the phase difference detection pixels, and the pixel Ph1 is formed such that one side is shielded across the edge portion 41. The pixel Ph2 is formed such that the other side of the pixel Ph2 is shielded across the edge portion 41.

Figure 24:
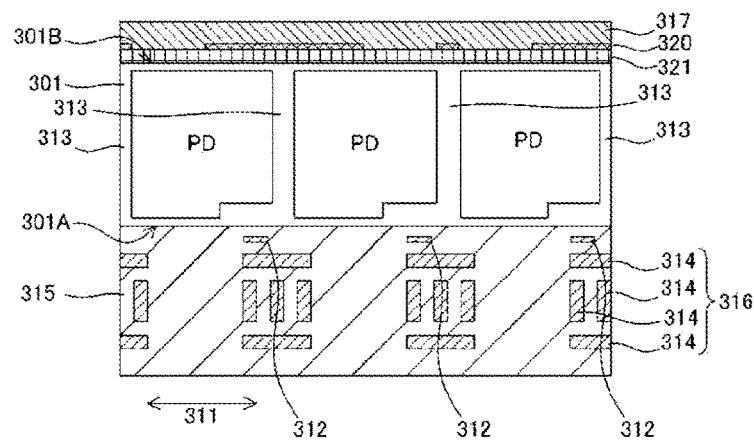
FIG. 24 is a diagram depicting main parts of the solid-state imaging device in each step of the manufacturing method of the solid-state imaging device.

Next, as depicted in FIG. 24, the transparent planarization film 317 is formed on the substrate back surface 301B through the interlayer insulating film 321 and the light shielding film 320. The planarization film 317 is formed by, for example, depositing a thermoplastic resin by a spin coating method and then executing a thermal curing process. Note that the planarization film 317 may be formed by depositing an inorganic film, such as a silicon oxide film, and planarizing the film by chemical mechanical polishing. As a result, the light shielding film 320 is provided in the planarization film 317.

Figure 25:
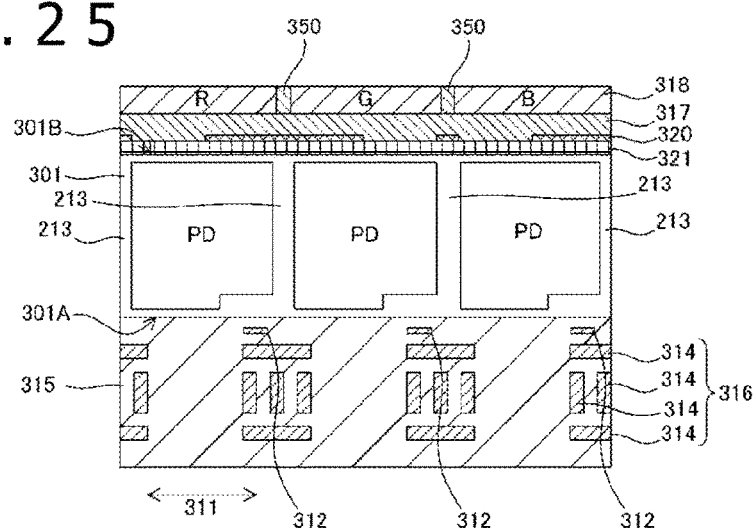
FIG. 25 is a diagram depicting main parts of the solid-state imaging device in each step of the manufacturing method of the solid-state imaging device.

Next, the color filter layer 318 and partition walls 350 are formed on the planarization film 317 as depicted in FIG. 25. The color filter layer 318 and the partition walls 350 are formed by, for example, using a coating method, such as a spin coating method, to apply a coating liquid containing a coloring material, such as pigments and dyes, and a photosensitive resin to form a coating film and then executing pattern processing of the coating film based on a lithography technique.

The color filter of each color can be formed, for example, as follows. First, a coating liquid containing a coloring material for obtaining spectral characteristics of the color to be formed and a photosensitive resin is applied by a spin coating method to deposit a photoresist film (not depicted). Subsequently, a prebaking process is applied, and then the pattern processing is applied to the photoresist film to form the color filter of a desirable color.

Figure 26:
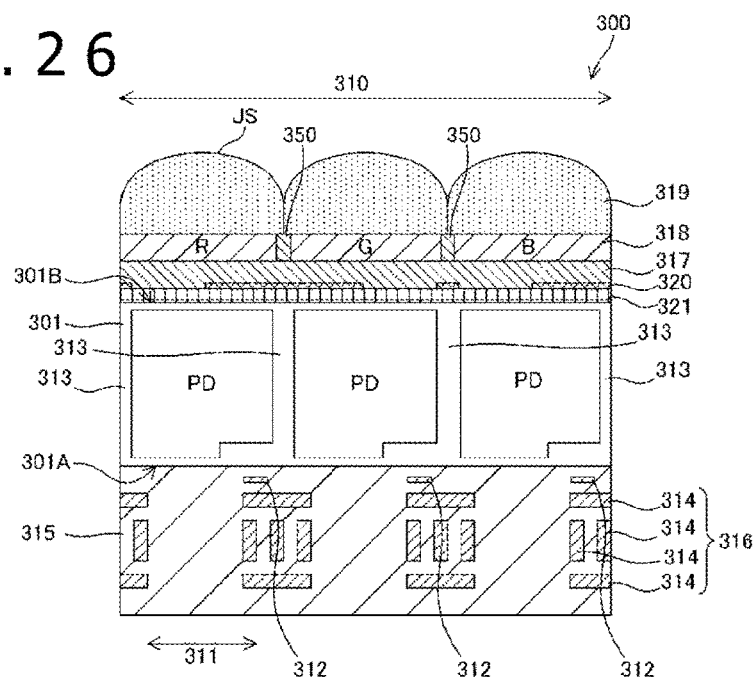
FIG. 26 is a diagram depicting main parts of the solid-state imaging device in each step of the manufacturing method of the solid-state imaging device.

Next, the microlenses 319 are formed on the color filter layer 318 as depicted in FIG. 26. The microlenses 319 are formed by, for example, depositing a positive photoresist film on the color filter layer 318 and then processing the film. Here, the microlenses 319 are provided as convex lenses with the centers thicker than the edges in the direction from the light receiving surface JS toward the color filter layer 318.

Examples of the material of the microlenses include organic materials, such as a styrene resin, an acrylic resin, a styrene acrylic copolymer resin, and a siloxane resin. To form the shape of the lens, for example, a photosensitive material containing a novolak resin as a main ingredient is used as a photoresist to form a pattern based on a lithography technique, and a heat treatment is applied to the patterned photoresist at a temperature higher than the thermal softening point to form the lens shape. The resist in the lens shape is used as a mask, and a dry etching method is used to transfer the pattern of the lens shape to the lens material of the foundation. The lenses are formed on all the pixels. Note that the formation of the microlenses is not limited to this method, and for example, a method may be adopted, in which deposition, prebaking, exposure, development, and bleaching exposure process of the lens material made of a photosensitive resin are sequentially performed, and then the heat treatment is applied to the material at a temperature higher than the thermal softening point of the photosensitive resin.

The present technique is not limited to the above-described embodiments, and the present technique also includes: configurations obtained by replacing the configurations disclosed in the above-described embodiments with each other or configurations obtained by changing the combinations of the configurations; configurations obtained by replacing well-known techniques and the configurations disclosed in the above-described embodiments with each other or configurations obtained by changing the combinations of the techniques and the configurations; and the like. The technical range of the present technique is not limited to the above-described embodiments, and the technical range also includes the matters written in the claims and equivalents of the matters.

The present technique can have the following configurations.

(1)

A solid-state imaging device including:

a pixel including a microlens that condenses light from a subject, a photoelectric conversion unit that receives the subject light condensed by the microlens to generate an electrical signal according to an amount of received light, and a light shielding portion provided between the photoelectric conversion unit and the microlens, in which the light shielding portion includes an edge portion formed across over a light receiving surface of the photoelectric conversion unit, and the edge portion includes a first edge portion and a second edge portion at positions different from each other both in a first direction corresponding to an up and down direction of an output image and a second direction corresponding to a left and right direction of the output image.

(2)

A solid-state imaging device including:

a pixel including a microlens that condenses light from a subject, a photoelectric conversion unit that receives the subject light condensed by the microlens to generate an electrical signal according to an amount of received light, and a light shielding portion provided between the photoelectric conversion unit and the microlens, in which the light shielding portion includes an edge portion formed across over a light receiving surface of the photoelectric conversion unit, and the edge portion includes a stepped portion on a midway of the edge portion.

(3)

A solid-state imaging device including:

a pixel including a microlens that condenses light from a subject, a photoelectric conversion unit that receives the subject light condensed by the microlens to generate an electrical signal according to an amount of received light, and a light shielding portion provided between the photoelectric conversion unit and the microlens, in which the pixel is formed at a corner section of the solid-state imaging device, the light shielding portion includes an edge portion formed across over a light receiving surface of the photoelectric conversion unit, and the edge portion is formed across over the light receiving surface of the photoelectric conversion unit in a third direction different from both a first direction corresponding to an up and down direction of an output image and a second direction corresponding to a left and right direction of the output image.

(4)

The solid-state imaging device according to (3), in which the third direction is a direction along a radiation ray extending from an optical axis center of a light receiving surface of the solid-state imaging device.

(5)

The solid-state imaging device according to (4), in which the edge portion is formed in a zigzag by a combination of direction lines different from the direction along the radiation ray.

(6)

The solid-state imaging device according to any one of (1) to (5), in which the solid-state imaging device includes a plurality of pixels, the pixels including the light shielding portions are provided in pairs, and the light shielding portions of the pixels in pairs are formed to shield different ranges of light receiving surfaces of the pixels.

(7)
An imaging apparatus including:
a solid-state imaging device including
a pixel including
a microlens that condenses light from a subject,
a photoelectric conversion unit that receives the subject light condensed by the microlens to generate an electrical signal according to an amount of received light, and
a light shielding portion provided between the photoelectric conversion unit and the microlens,
in which the light shielding portion includes an edge portion formed across over a light receiving surface of the photoelectric conversion unit, and
the edge portion includes a first edge portion and a second edge portion at positions different from each other both in a first direction corresponding to an up and down direction of an output image and a second direction corresponding to a left and right direction of the output image; and
a focus determination unit that performs focus determination through phase difference detection based on the signal generated by the pixel.

(8)
An imaging apparatus including:
a solid-state imaging device including
a pixel including
a microlens that condenses light from a subject,
a photoelectric conversion unit that receives the subject light condensed by the microlens to generate an electrical signal according to an amount of received light, and
a light shielding portion provided between the photoelectric conversion unit and the microlens,
in which the light shielding portion includes an edge portion formed across over a light receiving surface of the photoelectric conversion unit, and
the edge portion includes a stepped portion on a midway of the edge portion; and
a focus determination unit that performs focus determination through phase difference detection based on the signal generated by the pixel.

(9)
An imaging apparatus including:
a solid-state imaging device including
a pixel including
a microlens that condenses light from a subject,
a photoelectric conversion unit that receives the subject light condensed by the microlens to generate an electrical signal according to an amount of received light, and
a light shielding portion provided between the photoelectric conversion unit and the microlens,
in which the pixel is formed at a corner section of the solid-state imaging device,
the light shielding portion includes an edge portion formed across over a light receiving surface of the photoelectric conversion unit, and
the edge portion is formed across over the light receiving surface of the photoelectric conversion unit in a third direction different from both a first direction corresponding to an up and down direction of an output image and a second direction corresponding to a left and right direction of the output image; and
a focus determination unit that performs focus determination through phase difference detection based on the signal generated by the pixel.

(10)
A manufacturing method of a solid-state imaging device, the manufacturing method including
a step of forming a pixel, the pixel including
a microlens that condenses light from a subject,
a photoelectric conversion unit that receives the subject light condensed by the microlens to generate an electrical signal according to an amount of received light, and
a light shielding portion provided between the photoelectric conversion unit and the microlens,
in which the light shielding portion includes an edge portion formed across over a light receiving surface of the photoelectric conversion unit, and
the edge portion includes a first edge portion and a second edge portion at positions different from each other both in a first direction corresponding to an up and down direction of an output image and a second direction corresponding to a left and right direction of the output image.

(11)
A manufacturing method of a solid-state imaging device, the manufacturing method including
a step of forming a pixel, the pixel including
a microlens that condenses light from a subject,
a photoelectric conversion unit that receives the subject light condensed by the microlens to generate an electrical signal according to an amount of received light, and
a light shielding portion provided between the photoelectric conversion unit and the microlens,
in which the light shielding portion includes an edge portion formed across over a light receiving surface of the photoelectric conversion unit, and
the edge portion includes a stepped portion on a midway of the edge portion.

(12)
A manufacturing method of a solid-state imaging device, the manufacturing method including
a step of forming a pixel, the pixel including
a microlens that condenses light from a subject,
a photoelectric conversion unit that receives the subject light condensed by the microlens to generate an electrical signal according to an amount of received light, and
a light shielding portion provided between the photoelectric conversion unit and the microlens,
in which the pixel is formed at a corner section of the solid-state imaging device,
the light shielding portion includes an edge portion formed across over a light receiving surface of the photoelectric conversion unit, and
the edge portion is formed across over the light receiving surface of the photoelectric conversion unit in a third direction different from both a first direction corresponding to an up and down direction of an output image and a second direction corresponding to a left and right direction of the output image.

REFERENCE SIGNS LIST

10 . . . Light receiving unit, 12 . . . Solid-state imaging apparatus, 20 . . . Photodiode, 11 . . . Light receiving surface 10c . . . Optical axis center, 30 . . . Microlens, 40 . . . Light shielding portion, 41 . . . Edge portion, 41G . . . Stepped portion, 100 . . . Solid-state imaging device, 110 . . . Light receiving surface, 121 . . . Pixel unit, 122 . . . Vertical drive unit, 123 . . . Analog digital conversion unit (AD conversion unit), 124 . . . Reference signal generation unit, 125 . . . Horizontal drive unit, 126 . . . Timing control unit, 127 . . . Signal processing unit, 200 . . . Imaging apparatus, 210 . . . Lens unit, 210A . . . First lens unit, 210B . . . Second lens unit, 211 . . . Zoom lens, 212 . . . Diaphragm, 213 . . . Focus lens, 214 . . . Lens control unit, 220 . . . Operation unit, 230 . . . Control unit, 240 . . . Solid-state imaging device, 250 . . . Signal processing unit, 260 . . . Storage unit, 270 . . . Display unit, 280 . . . Focus determination unit, 290 . . . Drive unit, 300 . . . Solid-state imaging device, 301 . . . Semiconductor substrate, 301A . . . Substrate front surface, 301B . . . Substrate back surface, 310 . . . Pixel region, 311 . . . Unit pixel, 312 . . . Gate electrode, 313 . . . Device isolation region, 314 . . . Wire, 315 . . . Interlayer insulating film, 316 . . . Multilayer wiring layer, 317 . . . Planarization film, 318 . . . Color filter layer, 319 . . . Microlens, 320 . . . Light shielding film, 321 . . . Interlayer insulating film, 350 . . . Partition wall, 411 . . . First edge portion, 412 . . . Second edge portion, D1 . . . First direction, D2 . . . Second direction, D3 . . . Third direction, D4 . . . Fourth direction, Da . . . Received light data, Db . . . Received light data, Dd . . . Wave detection direction, Dr . . . Radiation ray, G1 . . . First chief ray angle group, G2 . . . Second chief ray angle group, L1 . . . First line, L2 . . . Second line, P . . . Pixel, PD . . . Photodiode, PG . . . Image generation pixel group, PL . . . Phase difference detection pixel group, Ph . . . Pixel, Ph1 . . . Pixel, Ph2 . . . Pixel

The invention claimed is:

1. A solid-state imaging device, comprising;
a first pixel, including:
a first microlens that condenses light;
a first photoelectric conversion unit that receives the light condensed by the first microlens to generate a first electrical signal according to an amount of received light; and
a first light shield provided between the first photoelectric conversion unit and the first microlens, wherein the first light shield comprises an edge positioned over a light receiving surface of the first photoelectric conversion unit approximately along a first radiation ray extending from an optical axis center of a light receiving surface of the solid-state imaging device; and
a second pixel adjacent to the first pixel in a first direction, the second pixel including:
a second microlens that condenses light;
a second photoelectric conversion unit that receives the light condensed by the second microlens to generate a second electrical signal according to an amount of received light; and
a second light shield provided between the second photoelectric conversion unit and the second microlens, wherein the second light shield comprises an edge positioned over a light receiving surface of the second photoelectric conversion unit approximately along a second radiation ray extending from the optical axis center of the light receiving surface of the solid-state imaging device,
wherein a first area of the first light shield that covers a part of the first pixel is based on a first distance from the optical axis center to the first pixel, and
wherein a second area of the second light shield that covers a part of the second pixel is based on a second distance from the optical axis center to the second pixel, wherein a size the first area is different from a size the second area due to a difference between the first distance and the second distance.

2. The solid-state imaging device according to claim 1, wherein the edge of the first light shield extends along the first radiation ray.

3. The solid-state imaging device according to claim 2, wherein the edge of the first light shield extends in a second direction.

4. The solid-state imaging device according to claim 1, wherein the edge of the first light shield extends approximately along the first radiation ray and includes first and second edge portions.

5. The solid-state imaging device according to claim 4, wherein the edge of the first light shield extends in a zigzag pattern formed by the first and second edge portions.

6. The solid-state imaging device according to claim 1, wherein the edge of the first light shield is formed in a zigzag pattern by a combination of direction lines extending in directions different from a direction along the first radiation ray.

7. The solid-state imaging device according to claim 1, wherein the edge of the first light shield extends from a first side of the first pixel to a second side of the first pixel opposite the first side.

8. The solid-state imaging device according to claim 1, wherein the edge of the first light shield extends in a direction that is inclined with respect to a side of the first pixel.

9. The solid-state imaging device according to claim 1, wherein the edge of the first light shield includes at least two stepped portions.

10. The solid-state imaging device according to claim 1, wherein an angle of the edge of the first light shield of the first pixel relative to the first direction is different than an angle of the edge of the second light shield of the second pixel relative to the first direction.

11. An imaging apparatus, comprising:
a solid-state imaging device including:
a first pixel, including:
a first microlens that condenses light;
a first photoelectric conversion unit that receives the light condensed by the first microlens to generate a first electrical signal according to an amount of received light; and
a first light shield provided between the first photoelectric conversion unit and the first microlens, wherein the first light shield comprises an edge positioned over a light receiving surface of the first photoelectric conversion unit approximately along a first radiation ray extending from an optical axis center of a light receiving surface of the solid-state imaging device; and
a second pixel adjacent to the first pixel in a first direction, the second pixel including:
a second microlens that condenses light;
a second photoelectric conversion unit that receives the light condensed by the second microlens to generate a second electrical signal according to an amount of received light; and
a second light shield provided between the second photoelectric conversion unit and the second microlens, wherein the second light shield comprises an edge positioned over a light receiving surface of the second photoelectric conversion unit approximately along a second radiation ray extending from the optical axis center of the light receiving surface of the solid-state imaging device, wherein a first area of the first light shield that covers a part of the first pixel is based on a first distance from the optical axis center to the first pixel, and wherein a second area of the second light shield that covers a part of the second pixel is based on a second distance from the optical axis center to the second pixel, wherein a size of the first area is different from a size of the second area due to a difference between the first distance and the second distance.

12. The imaging apparatus according to claim 11, wherein the edge of the first light shield extends along the first radiation ray.

13. The imaging apparatus according to claim 12, wherein the edge of the first light shield extends in a second direction.

14. The imaging apparatus according to claim 11, wherein the edge of the first light shield extends approximately along the first radiation ray and includes first and second edge portions.

15. The imaging apparatus according to claim 14, wherein the edge of the first light shield extends in a zigzag pattern formed by the first and second edge portions.

16. The imaging apparatus according to claim 11, wherein the edge of the first light shield is formed in a zigzag pattern by a combination of direction lines extending in directions different from a direction along the first radiation ray.

17. The imaging apparatus according to claim 11, wherein the edge of the first light shield extends from a first side of the first pixel to a second side of the first pixel opposite the first side.

18. The imaging apparatus according to claim 11, wherein the edge of the first light shield extends in a direction that is inclined with respect to a side of the first pixel.

19. The imaging apparatus according to claim 11, wherein the edge of the first light shield includes at least two stepped portions.

20. The imaging apparatus according to claim 11, wherein an angle of the edge of the first light shield of the first pixel relative to the first direction is different than an angle of the edge of the second light shield of the second pixel relative to the first direction.

* * * * *